(12) United States Patent
Dachang et al.

(10) Patent No.: US 9,922,142 B2
(45) Date of Patent: Mar. 20, 2018

(54) SYSTEMS AND METHODS FOR SUBSURFACE RESERVOIR SIMULATION

(75) Inventors: Li Dachang, Katy, TX (US); Aaron G. Dawson, III, The Woodlands, TX (US); Abimbola B. Obigbesan, Conception Bay South (CA); Dosite Samuel Perkins, II, Spring, TX (US); Steven Gale Smith, Houston, TX (US); Andrew W. Stackel, Sugar Land, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 1094 days.

(21) Appl. No.: 13/990,757

(22) PCT Filed: Sep. 29, 2011

(86) PCT No.: PCT/US2011/053977
§ 371 (c)(1),
(2), (4) Date: May 30, 2013

(87) PCT Pub. No.: WO2012/091775
PCT Pub. Date: Jul. 5, 2012

(65) Prior Publication Data
US 2013/0275106 A1   Oct. 17, 2013

Related U.S. Application Data

(60) Provisional application No. 61/428,436, filed on Dec. 30, 2010.

(51) Int. Cl.
*G06G 7/58* (2006.01)
*G06F 17/50* (2006.01)
*G01V 11/00* (2006.01)

(52) U.S. Cl.
CPC .......... *G06F 17/5009* (2013.01); *G01V 11/00* (2013.01); *G06F 17/5018* (2013.01)

(58) Field of Classification Search
CPC .... G01V 1/282; G01V 2210/66; G01V 11/00; G01V 1/28; G01V 1/30; G01V 1/301;
(Continued)

(56) References Cited

U.S. PATENT DOCUMENTS 5,740,342 A     4/1998   Kocberber
6,018,497 A *   1/2000   Gunasekera .............. G01V 1/28
                                                                367/38
(Continued)

FOREIGN PATENT DOCUMENTS

WO   WO2007/061618    5/2007
WO   WO2008/150325   12/2008

OTHER PUBLICATIONS

E100_Manual_1999.pdf Eclipse 100 User Course, Schlumberger, GeoQuest 1999.*
(Continued)

*Primary Examiner* — Kamini S Shah
*Assistant Examiner* — Brian S Cook
(74) *Attorney, Agent, or Firm* — ExxonMobil Upstream Research Company—Law Department

(57) ABSTRACT

Systems and methods for providing a reservoir simulation are based on data from an unstructured grid using a structured grid reservoir simulator. Exemplary methods comprise obtaining an unstructured grid reservoir model comprising a reservoir model discretized on an unstructured grid. A virtual structured grid is defined for the unstructured grid reservoir model. The unstructured grid is aligned with the virtual structured grid by adding cells to the unstructured grid to make the unstructured grid and virtual structured grid have the same number of cells. The virtual structured grid (Continued)

may be represented in the unstructured grid. Structured grid reservoir simulator input data comprising reservoir model data assigned to the virtual structured grid is prepared based on reservoir model data in the unstructured grid model. A structured grid reservoir simulation is performed using the structured grid reservoir simulator input data to produce a reservoir simulation.

14 Claims, 17 Drawing Sheets

(58) Field of Classification Search
CPC ........ G01V 1/48; G01V 1/50; G06F 17/5009; G06F 17/5018
USPC .......................................................... 703/10
See application file for complete search history.

(56) References Cited

U.S. PATENT DOCUMENTS

| | | | |
|---|---|---|---|
| 6,078,869 | A | 6/2000 | Gunasekera |
| 6,106,561 | A | 8/2000 | Farmer |
| 6,662,146 | B1 | 12/2003 | Watts, III |
| 6,928,399 | B1 | 8/2005 | Watts, III et al. |
| 7,043,413 | B2 | 5/2006 | Ward et al. |
| 7,047,165 | B2 | 5/2006 | Balaven et al. |
| 7,096,122 | B2 | 8/2006 | Han |
| 7,451,066 | B2 | 11/2008 | Edwards et al. |
| 7,596,480 | B2 | 9/2009 | Fung et al. |
| 7,634,395 | B2 | 12/2009 | Flandrin et al. |
| 2002/0038201 | A1 | 3/2002 | Balaven et al. |
| 2005/0015231 | A1 | 1/2005 | Edwards et al. |
| 2006/0277013 | A1* | 12/2006 | Bennis .................... E21B 43/00 703/10 |

OTHER PUBLICATIONS

Pettersen_2006.pdf Basics of Reservoir Simulation with the Eclipse Reservoir Simulator, Lecture Notes, Dept. of Mathematicise, University of Bergen, 2006.*
Geoandgrid_2007.pdf Geometry Modeling & Grid Generation, ME469B/2/GI, 2007.*
Aarnes_2007 (Multiscale Mixed/Mimetic Methods on Corner-Point Grids, paper-rev3.tex; Mar. 14, 2007; 21:49; p. 1 Kluwer Academic Publishers. Printed in the Netherlands).*
Douglas_1997 (A Characterization of Mapping Unstructured Grids onto Structured Grids and Using Multigrid as a Preconditioner, BIT, Feb. 12, 1997).*
Amit_2006.pdf Amit's Thoughts on Grids, Jan. 9, 2006 downloaded from http://www-cs-students.stanford.edu/~amitp/game-programming/grids/.*
Mello_2003 (A Topologically Based Framework for 3-D Basin Modeling S. Duppenbecker, R. Marzi (Eds.), Multidimensional Basin Modeling, AAPG/Datapages Discovery Series, No. 7 (2003), pp. 255-269).*
Model_defined.pdf, randomhouse college dictionary 1982.*
Sheffer_1997 Geometric Modeling: Theory and Practice, Virtual Topology Construction and Applications, p. 247, Springer, 1997.*
Sheffer_2000 Virtual Topology Operators for Meshing. Int. J. Computing Geometry Appl., 10(3):309-331, 2000.*
Beckner, B.L., et al. (2001) "EMpower: New Reservoir Simulation System," *SPE 68116-MS* presented at SPE Middle East Oil Show, Mar. 17-20 Bahrain.
Fjerstad, P.A., et al. (2005) "Next Generation Parallel Computing for Large-Scale Reservoir Simulation," SPE paper 97358-MS presented at SPE International Improved Oil Recovery Conference in Asia Pacific, Dec. 5-6, 2005, Kuala Lumpur, Malaysia.
PCT/US2011/53977 International Search Report dated Feb. 21, 2012.

* cited by examiner

200

400

502

504

500 a. Map View of an Unstructured Grid
702 b. Map View of a Virtual Structured Grid
704

700

1200

1400

1500

SYSTEMS AND METHODS FOR SUBSURFACE RESERVOIR SIMULATION

CROSS-REFERENCE TO RELATED APPLICATION

This application is the National Stage of International Application No. PCT/US2011/053977, filed 29 Sep. 2011, which claims the priority benefit of U.S. Provisional Patent Application 61/428,436 filed 30 Dec. 2010 entitled SYSTEMS AND METHODS FOR SUBSURFACE RESERVOIR SIMULATION, the entirety of which is incorporated by reference herein.

FIELD

The present techniques relate to subsurface reservoir simulation, including providing three-dimensional (3D) data and/or visualizations of data corresponding to physical objects and analysis thereof. In particular, exemplary embodiments of the present techniques relate to methods of simulating a subsurface reservoir for reservoir performance prediction.

BACKGROUND

This section is intended to introduce various aspects of the art, which may be associated with embodiments of the disclosed techniques. This discussion is believed to assist in providing a framework to facilitate a better understanding of particular aspects of the disclosed techniques. Accordingly, it should be understood that this section is to be read in this light, and not necessarily as admissions of prior art.

Three-dimensional (3D) model construction and visualization have been widely accepted by numerous disciplines as a mechanism for analyzing, communicating, and comprehending complex 3D datasets. Examples of structures that can be subjected to 3D analysis include the earth's subsurface, facility designs and the human body.

3D modeling techniques are important during exploration, development and production phases in the oil and gas industry. For example, reservoir simulation is routinely applied for making development and production strategies to optimize the recovery of hydrocarbon reservoirs that may hold billions of barrels of hydrocarbon fluids.

The ability to easily interrogate and explore 3D models is one aspect of 3D visualization. Relevant models may contain both 3D volumetric objects and co-located 3D polygonal objects. Examples of volumetric objects include seismic volumes, MRI scans, reservoir simulation models, and geologic models. Interpreted horizons, faults and well trajectories are examples of polygonal objects.

3D volumetric objects may be divided into two basic categories: structured grids and unstructured grids. Both structured and unstructured grids may be rendered for a user to explore and understand the associated data. There are large numbers of known volume simulation techniques for structured grids and unstructured grids.

In the oil and gas industry, reservoir simulators exist for operating on structured grids and unstructured grids. Typically, simulators will operate on one grid type or the other, not both.

Structured grid based simulators have been used in the oil industry for several decades and they have been proven to be efficient and stable for industry applications. Unstructured grid based simulators are newer and they have advantages over structured grid based simulators that unstructured grid based simulators can model reservoir internal and external geometries more accurately, and as a result, they give more accurate reservoir performance prediction. Unstructured grid based reservoir simulators are not commercially available. As a result, technical service companies have been trying to rewrite their commercially available structured grid based simulators with unstructured grids for some time. The rewriting process, however, is complicated, time-consuming, and expensive.

In order to convert reservoir models constructed with an unstructured grid so they are usable by structured grid based simulators, workarounds are used. For example, some workarounds involve building a structured grid to mimic the original unstructured grid model to be converted. This process is time consuming and can become very difficult or even impossible when the unstructured grid model is highly faulted and structurally complicated. The situation is worse when there are a lot of history match changes in the unstructured grid reservoir model to be converted. History matching is a process of modifying or tuning the properties of a reservoir model for a better match of the model prediction to observed reservoir production data. The process is to increase the confidence of model prediction. History matching changes on the reservoir properties can be within a cell and on the faces of the cell. An unstructured grid cell (with arbitrary number of faces) generally has more faces than can be handled by a structured grid cell (limited to six faces). As a result, history matching changes cannot be accurately mapped from an unstructured grid to a structured grid, which makes the conversion from the unstructured model to the structured model impossible.

As suggested above, many efforts have been made previously in this area. Among the prior U.S. patents related to the technology disclosed herein, the following non-exclusive list is representative of those efforts: U.S. Pat. Nos. 6,928,399; 7,043,413; 6,106,561; 7,047,165; 6,018,497; 6,078,869; 5,740,342; 7,634,395; 7,451,066; and 7,596,480. International Patent Application Publication No. WO2008150325 is also related to the presently described technologies.

SUMMARY

Exemplary embodiments of the present techniques comprise exemplary methods for providing a reservoir simulation based on data from an unstructured grid using a structured grid reservoir simulator. The exemplary method comprises obtaining an unstructured grid reservoir model comprising a reservoir model discretized on an unstructured grid. A virtual structured grid is defined for the unstructured grid reservoir model. The unstructured grid is aligned with the virtual structured grid by adding cells to the unstructured grid to make the unstructured grid and virtual structured grid have the same number of cells. The virtual structured grid may be represented in the unstructured grid using a one-to-one correspondence between cells in the unstructured grid and virtual structured grid. Structured grid reservoir simulator input data comprising reservoir model data assigned to the virtual structured grid is prepared based on reservoir model data in the unstructured grid model. A structured grid reservoir simulation is performed using the structured grid reservoir simulator input data to produce a reservoir simulation.

Exemplary computer systems are adapted to provide a reservoir simulation based on data from an unstructured grid using a structured grid reservoir simulator. The exemplary computer systems comprise a processor and a non-transitory, computer-readable storage medium that stores computer-readable instructions for execution by the processor. The computer-readable instructions may include code that, when executed by the processor, is adapted to cause the processor to obtain an unstructured grid reservoir model comprising a reservoir model discretized on an unstructured grid. Additional code stored on the computer-readable storage medium includes code that is adapted to cause the processor to define a virtual structured grid for the unstructured grid reservoir model. Still additional instructions stored on the computer-readable storage medium comprises code that is adapted to cause the processor to align the unstructured grid with the virtual structured grid comprising the addition of cells to the unstructured grid so to make the unstructured grid and virtual structured grid have the same number of cells. Also stored on the computer-readable storage medium is code that is adapted to cause the processor to represent the virtual structured grid in the unstructured grid using a one-to-one correspondence between cells in the unstructured grid and virtual structured grid. The computer-readable storage medium further stores code that is adapted to cause the processor to prepare structured grid reservoir simulator input data comprising reservoir model data assigned to the virtual structured grid based on reservoir model data in the unstructured grid model. The computer-readable storage medium also stores code that is adapted to cause the processor to run a structured grid reservoir simulation using the structured grid reservoir simulator input data to produce a reservoir simulation.

The present techniques relate to methods for producing hydrocarbons from an oil and/or gas field using a reservoir simulation of the oil and/or gas field. Exemplary methods for producing hydrocarbons include obtaining an unstructured grid reservoir model comprising a reservoir model discretized on an unstructured grid, the reservoir model representing the oil and/or gas field. A virtual structured grid is defined for the unstructured grid reservoir model. The unstructured grid is aligned with the virtual structured grid comprising the addition of cells to the unstructured grid so to make the unstructured grid and virtual structured grid have the same number of cells. The virtual structured grid may be represented in the unstructured grid using a one-to-one correspondence between cells in the unstructured grid and virtual structured grid. Structured grid reservoir simulator input data comprising reservoir model data assigned to the virtual structured grid may be prepared based on reservoir model data in the unstructured grid model. A structured grid reservoir simulation is performed using the structured grid reservoir simulator input data to produce a reservoir simulation of the oil and/or gas field. Finally, hydrocarbons may be extracted from the oil and/or gas field using the reservoir simulation.

Exemplary embodiments of the present techniques relate to methods of performing a reservoir simulation. Exemplary methods of performing a reservoir simulation comprise obtaining a reservoir model defined on an unstructured grid and counting the number of grid cells, M, in the unstructured grid. A set of integers whose product, N, is equal to or greater than M is defined. L dummy cells are added into the unstructured grid to form a second unstructured grid. In one embodiment, L is the difference between N and M. A one-to-one mapping of each cell in the second unstructured grid to a cell in a virtual structured grid is performed. Flow transmissibilities between cells in the structured grid may be defined based on the flow transmissibilities between cells in the unstructured grid. A reservoir simulation may then be performed based on the virtual structured grid using a structured grid reservoir simulator.

DESCRIPTION OF THE DRAWINGS

Advantages of the present techniques may become apparent upon reviewing the following detailed description and drawings of non-limiting examples of embodiments in which.

DETAILED DESCRIPTION

Figure 1:
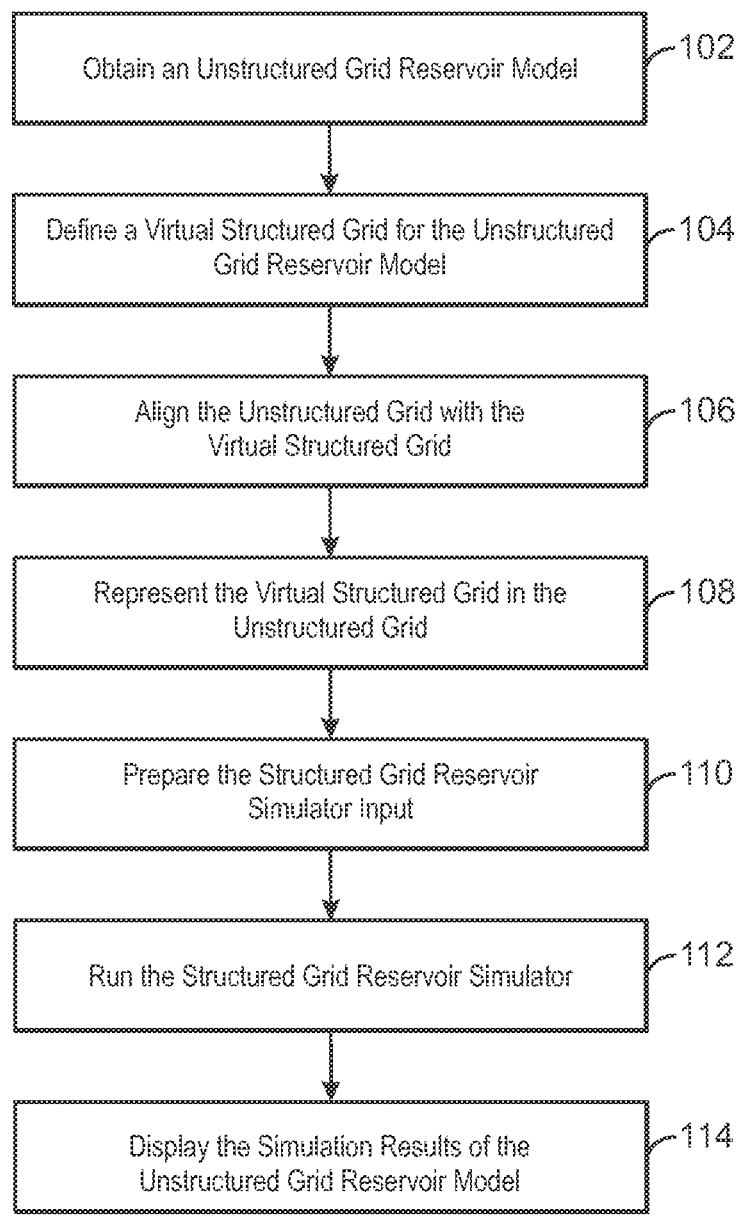
FIG. 1 is a process flow diagram showing methods for providing a reservoir simulation.

In the following detailed description section, specific embodiments are described in connection with preferred embodiments. However, to the extent that the following description is specific to a particular embodiment or a particular use, this is intended to be for exemplary purposes only and simply provides a description of the exemplary embodiments. Accordingly, the present techniques are not limited to embodiments described herein, but rather, it includes all alternatives, modifications, and equivalents falling within the spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent.

As used herein, the term "cell" refers to a collection of faces, or a collection of nodes that implicitly define faces, where the faces together form a closed volume.

As used herein, the term "computer component" refers to a computer-related entity, either hardware, firmware, software, a combination thereof, or software in execution. For example, a computer component can be, but is not limited to being, a process running on a processor, a processor, an object, an executable, a thread of execution, a program, and a computer. One or more computer components can reside within a process and/or thread of execution and a computer component can be localized on one computer and/or distributed between two or more computers.

As used herein, the terms "computer-readable medium", "non-transitory, computer-readable medium" or the like refer to any tangible storage that participates in providing instructions to a processor for execution. Such a medium may take many forms, including but not limited to, non-volatile media, and volatile media. Non-volatile media includes, for example, NVRAM, or magnetic or optical disks. Volatile media includes dynamic memory, such as main memory. Computer-readable media may include, for example, a floppy disk, a flexible disk, hard disk, magnetic tape, or any other magnetic medium, magneto-optical medium, a CD-ROM, any other optical medium, a RAM, a PROM, and EPROM, a FLASH-EPROM, a solid state medium like a holographic memory, a memory card, or any other memory chip or cartridge, or any other physical medium from which a computer can read. When the computer-readable media is configured as a database, it is to be understood that the database may be any type of database, such as relational, hierarchical, object-oriented, and/or the like. Accordingly, exemplary embodiments of the present techniques may be considered to include a tangible, non-transitory storage medium or tangible distribution medium and prior art-recognized equivalents and successor media, in which the software implementations embodying the present techniques are stored.

As used herein, the term "face" refers to an arbitrary collection of points that form a surface.

As used herein, the term "fault" refers to a break in the earth layer and the adjacent horizon surfaces, across which there is observable displacement. A fault may either block the flow of hydrocarbons, creating a trap in which hydrocarbons may collect, or enhance the flow of hydrocarbons between regions in a reservoir.

As used herein, the term "fluid contact" refers to an interface between two different fluids, e.g., oil and water.

As used herein, the term "geologic model" refers to a model that is topologically structured in i,j,k space but geometrically varied. A geologic model may be defined in terms of nodes and cells. Geologic models can also be defined via pillars (lines connecting the vertical edges of a column of cells). A geologic model may be visually rendered as a shell (i.e., a volume with data displayed only on outer surfaces).

As used herein, the term "i,j,k space" refers to a local horizontal reference frame for a geo-cellular model having specified integer coordinates for (i,j,k) for consecutive cells. By convention, k represents a vertical coordinate. i,j,k space may be used as a sample space in which each coordinate represents a single sample value without reference to a physical characteristic.

As used herein, the term "node" refers to a collection of points defining one topological location in i,j,k space. Unless a split or fault condition is associated with the node, nodes have only one point.

As used herein, the term "point" refers to an X,Y,Z location in 3D space.

As used herein, the term "polyline" refers to an ordering of points. A polyline may be displayed as connected line segments (or cylinders) and may or may not be closed. Properties of polylines may be used to provide color or varying the thickness of the polyline and may be discrete or interpolated between known points.

As used herein, the term "property" refers to data representative of a characteristic associated with different topological elements on a per element basis. Generally, a property could be any computing value type, including integer and floating point number types or the like. Moreover, a property may comprise vectors of value types. Properties may only be valid for a subset of a geometry object's elements. Properties may be used to color an object's geometry. The term "property" may also refer to a characteristic or stored information related to an object. Application of the appropriate definition is intuitive to one skilled in the art of computer science.

As used herein, the term "structured grid" refers to a matrix of volume data points known as voxels. Structured grids are typically used with seismic data volumes or medical imaging.

As used herein, the term "topological elements" refers to the building blocks of an object. Points, faces, or cells are the most common examples.

As used herein, the term "unstructured grid" refers to a collection of cells with arbitrary geometries. Each cell can have the shape of a prism, hexahedron, or other more complex 3D geometries. When compared to structured grids, unstructured grids can better represent actual data since unstructured grids can contain finer (i.e. smaller) cells in one area with sudden changes in value of a property, and coarser (i.e. larger) cells elsewhere where the value of the property changes more slowly. Finer cells may also be used in areas having more accurate measurements or data certainty (for example, in the vicinity of a well). The flexibility to define cell geometry allows the unstructured grid to represent physical properties better than structured grids. In addition, unstructured grid cells can also better resemble the actual geometries of subsurface layers because cell shape is not restricted to a cube and may be given any orientation. However, all cell geometries need to be stored explicitly, thus an unstructured grid may require a substantial amount of memory. Unstructured grids may be employed in connection with reservoir simulation models. Note that the term unstructured grid relates to how data is defined and does imply that the data itself has no structure. For example, one could represent a seismic model, typically represented by structured grids, as an unstructured grid with explicitly defined nodes and cells. The result would necessarily be more memory intensive and inefficient to process and visualize than the corresponding structured definition.

As used herein, the term "unstructured surface" refers to a collection of points and polygonal faces. Unstructured surfaces may be visually rendered as surfaces. Properties may be used to color the surface.

As used herein, the terms "visualization engine" or "VE" refer to a computer component that is adapted to present a model and/or visualization of data that represents one or more physical objects.

As used herein, the term "well" refers to a surface location with a collection of wellbores. Wells may be visually rendered as a point or a glyph, along with a name.

As used herein, the term "wellbore" refers to a constituent underground path of a well and associated collections of path dependent data. A wellbore may be visually rendered as a collection of connected line segments or curves. Wellbores may also be visually rendered cylindrically with a radius.

Some portions of the detailed description which follows are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. These quantities may be stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions using the terms such as "adjusting", "aligning", "assigning", "comparing", "computing", "creating", "defining", "determining", "displaying", "extracting", "identifying", "limiting", "obtaining", "performing", "predicting", "preparing", "processing", "producing", "providing", "representing", "running", "selecting", "storing", "summarizing", "transforming", "updating" or the like, refer to the action and processes of a computer system, or similar electronic computing device, that transforms data represented as physical (electronic) quantities within the computer system's registers and memories into other data similarly represented as physical quantities within the computer system memories or registers or other such information storage, transmission or display devices. Example methods may be better appreciated with reference to flow diagrams.

While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various serially occurring actions, it is to be appreciated that various actions could occur concurrently, substantially in parallel, and/or at substantially different points in time.

The need to provide communication between structured and unstructured grid-based simulators has been increasing as the hydrocarbon producing industry has moved toward joint ventures involving very large projects. In addition, converting unstructured grid based simulation models for use with a commercially available reservoir simulator (which is structured grid based) is required by the governments of many countries.

Exemplary embodiments of the present techniques provide methods to address two issues. First, technical service companies may be provided with methods to develop unstructured grid based simulators without significantly changing or rewriting existing structured grid based simulators, which is highly cost effective. Second, exemplary embodiments may provide methods for converting an unstructured grid reservoir model to a structured grid reservoir simulator to meet the needs of governments and joint venture companies/partners.

Reservoir simulators typically include three parts: a preprocessor, a simulator engine, and a postprocessor. The preprocessor for a reservoir simulator is used to prepare input data for the engine of the simulator. Input data comprises a simulation grid, reservoir rock and fluid properties, reservoir initial condition, well data, and well management strategies. The engine of a reservoir simulator performs all numerical calculations using the input data and generates the results of the flow of reservoir fluids as a function of 3D location (x, y, z) and time (t). A postprocessor is used to assist reservoir engineers to analyze the simulation results. The postprocessor of the simulator displays the simulation results in a 3D window and the well results in plots.

Reservoir simulators simulate the flow of fluids in a reservoir by subdividing the continuous reservoir volume into small contiguous cells organized by a simulation grid that accurately describes the geometry of each cell and the connections between the cells. After the simulation grid is generated, a finite-difference/finite-volume numerical method or a finite-element numerical method is used to solve the discretized fluid flow problem. Currently, in the oil industry, only finite-difference/finite-volume methods are used in business applications while a limited number of finite-element methods are utilized for other purposes rather than business applications. The simulation grid is one of the most important components of a reservoir simulator and it affects all of the three parts of the simulator (preprocessor, simulator engine, and postprocessor).

There are two different grid types for finite-difference/finite-volume methods. Those two types are structured grids and unstructured grids. A structured grid divides a reservoir into small cells that often have six square or rectangular faces with two faces in each x or y or z direction. This grid is called structured because the grid can be managed using simple i, j, and k indices with respect to their physical x, y, and z directions. Because number of faces for each cell is fixed, management of the structured grid is simple and efficient. The major drawbacks of the structured grid are its inflexibility and level of difficulty to model internal reservoir geometry (e.g., faults, depositional boundaries, and wells) with sufficient numerical simulation accuracy. An unstructured grid splits the reservoir into small cells that can have any number of faces, especially the faces that are perpendicular to the horizontal directions. Since number of faces in each x or y or z direction is variable, i, j, and k indices cannot be used to manage the cells. The major advantages of the unstructured grid over the structured grid are its flexibility and capability to accurately describe internal and external reservoir geometries.

Commercially available reservoir simulators produced by oil field service companies typically use structured grids. Most of the unstructured grid based simulators are developed by oil companies and are typically not publicly available. The structured grid-based simulators have been used in the oil industry for several decades and they have been proven to be efficient and stable for industry applications. The unstructured grid-based simulators are relatively new and they have advantages over the structured grid based simulators in that the unstructured grid based simulators can model reservoir internal and external geometries more accurately, and as a result, they give more accurate reservoir performance prediction.

The present techniques relate to a method for performing unstructured grid reservoir simulation using a structured grid reservoir simulator. There are at least two major applications for such a method. For the first application, an exemplary embodiment can be used to do unstructured grid reservoir simulation in any existing, commercially available reservoir simulators which are structured grid based. Oil field technical service companies or others who have developed commercially available reservoir simulators can adapt their existing reservoir simulators for unstructured grid reservoir simulations without rewriting their simulator engines. This may allow avoidance of the costs of several years of simulator engine development. For the second application, the present techniques can be applied to convert an unstructured grid reservoir model into a structured grid reservoir simulator. This conversion may be exact, and may lead to a clone of an unstructured grid reservoir model in a structured grid reservoir simulator.

FIG. 1 is a process flow diagram 100 showing a method for providing a reservoir simulation according to an exemplary embodiment of the present techniques. At block 102, an unstructured grid reservoir model is obtained. Typically, unstructured grid reservoir models are either built internally by a company or obtained from a third party. The unstructured grid reservoir model comprises unstructured cells (non-rectangular in a bird's-eye view) or structured cells (rectangular in a bird's-eye view) or both with global layers that cover the entire model area and possibly with local layers that refine some region(s).

As explained herein, an unstructured grid reservoir model refers to a reservoir model built with an unstructured grid. Building an unstructured grid reservoir model can be accomplished by methods familiar to persons of ordinary skill in the art. An unstructured grid reservoir model can be built using typical unstructured grid generation software packages.

In general, a structured grid comprises any set continuous set of cells where: 1) all cells have the same number of sides, 2) each cell has the same set of vertex angles, and 3) each interior cell has the same number of neighboring cells which share a face. As described herein, an unstructured grid comprises any other grid which is not a structured grid. For example, a structured grid may be composed of rectangles, parallelograms, isosceles triangles, or symmetric hexagons. Cells in such grids cleanly fall into rows and columns (although the rows and columns may not be orthogonal). Most of the structured grid reservoir simulators in the oil industry are based on the structured grids that employ square or rectangular or distorted rectangular cells.

At block 104, a virtual structured grid that will be used to hold the unstructured grid model in a structured way is defined. The virtual structured grid has enough virtual cells to hold the cells in the unstructured grid. The unstructured grid is aligned with the virtual structured grid, as shown at block 106. This alignment helps to ensure that the unstructured grid and the virtual structured grid have the same number of cells. One virtual cell in the virtual structured grid corresponds to only one cell in the unstructured grid.

The virtual structured grid is represented in the unstructured grid, as shown at block 108. Virtual cell indices of the virtual structured grid may be explicitly represented in the unstructured grid as the link properties between the virtual structured grid and the unstructured grid. The process is accomplished by a joint manual and automatic process.

At block 110, input data to run the structured grid reservoir simulator is prepared. In an exemplary embodiment, all of the prepared input data have the same format as any other standard input data for the structured grid simulator. The structured grid simulator is run, as shown at block 112. At block 114, the simulation results of the structured grid reservoir simulator are displayed in the unstructured grid viewer. Simulation results generated by the structured grid reservoir simulator may be automatically mapped back to the unstructured grid viewer. The steps shown in FIG. 1 are described in greater detail herein.

Figure 2:
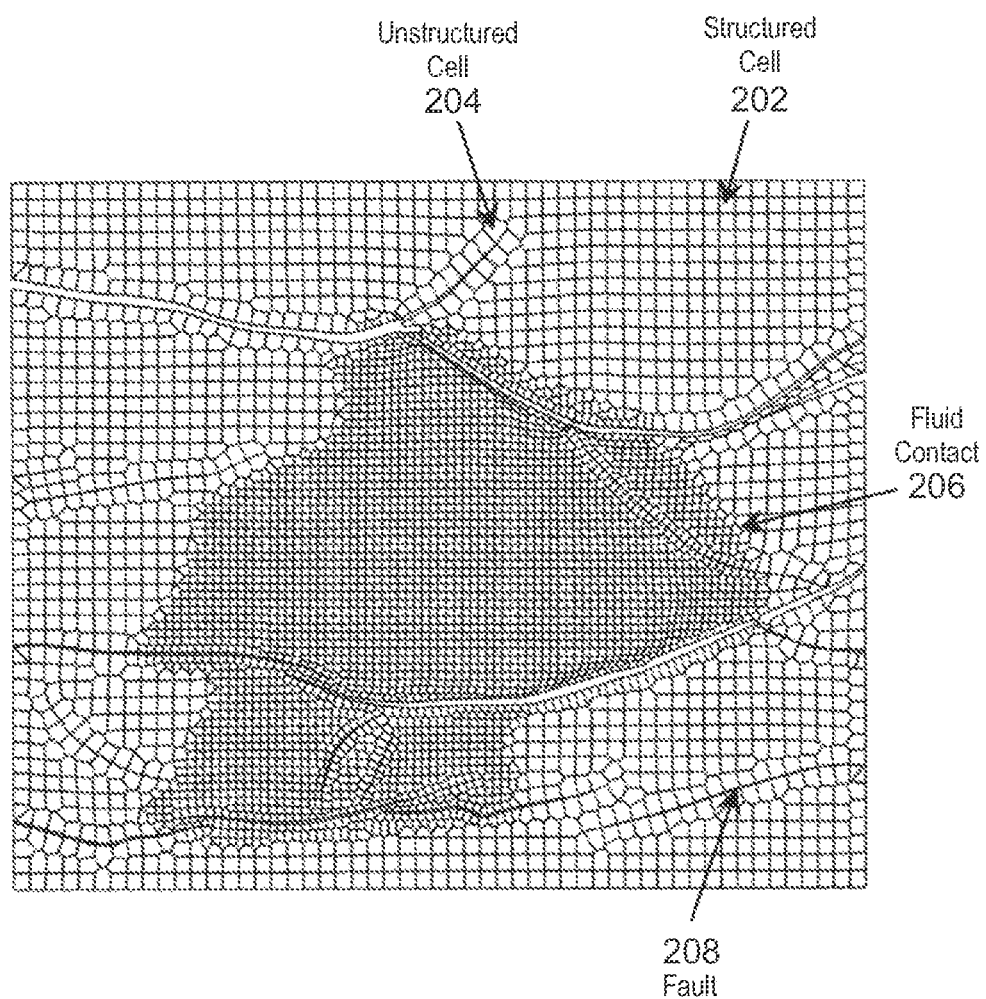
FIG. 2 is a diagram showing a horizontal (bird's-eye) view of a portion of an unstructured grid.

FIG. 2 is a diagram showing a horizontal (bird's-eye) view of a portion of an unstructured grid 200. From the bird's-eye view, the unstructured grid 200 comprises structured cells 202 and unstructured cells 204. A structured cell is a square or rectangular or distorted rectangular cell that has exactly four edges while an unstructured cell is a polygon whose number of edges is not equal to four. The number of edges for an unstructured cell could be three (triangle), five (pentagon), six (hexagon), and more.

In an unstructured grid reservoir model, structured cells may be used where there are no geological discontinuities, such as a fault or a fluid contact. Unstructured cells may be used for areas containing geological discontinuities. Structured cells are computationally efficient but geometrically inflexible. They are incapable of accurately describing geological discontinuities or interfaces. On the contrary, unstructured cells are geometrically flexible but computationally less efficient. Unstructured cells are used, but not limited to, near faults, contacts, wells, and a transition zone between different sizes of cells.

Figure 3:
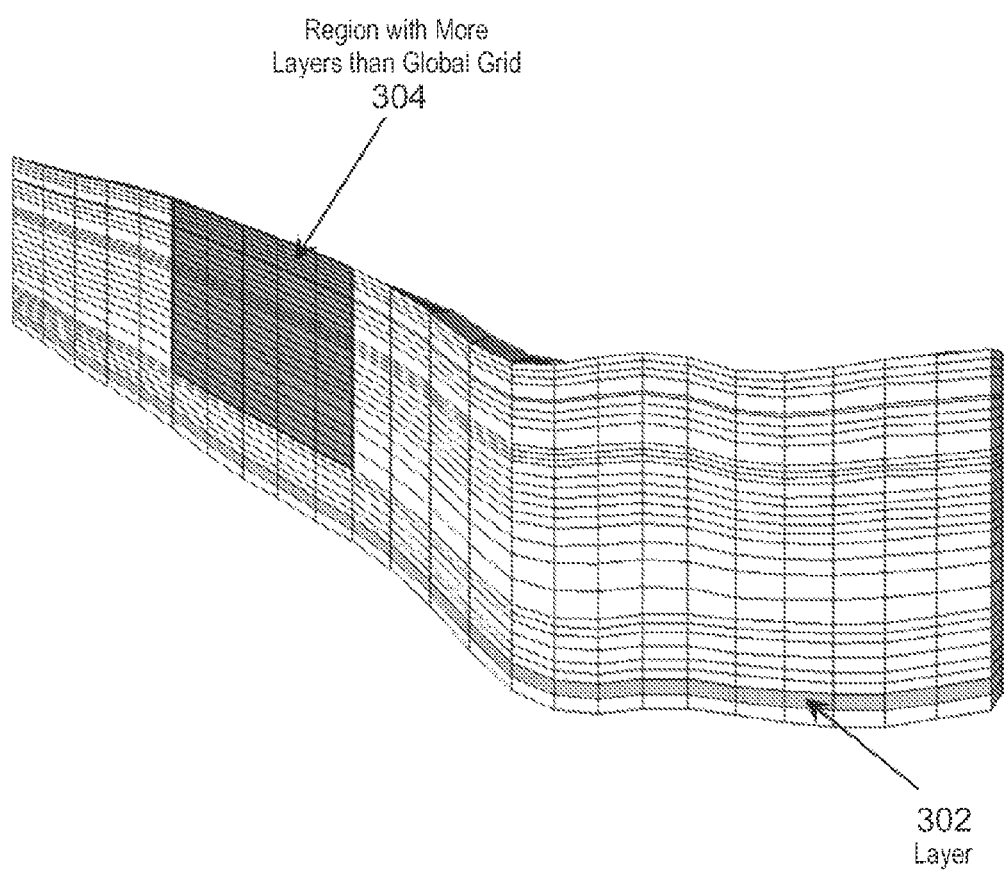
FIG. 3 is a cross-sectional (vertical) view of a portion of an unstructured grid.

FIG. 3 is a cross-sectional (vertical) view of a portion of an unstructured grid 300. In the unstructured grid portion 300, only one vertical slice of an unstructured grid model is displayed. In the cross-section view, cells (structured or unstructured in the bird's-eye view) are organized as layers. An exemplary layer is identified by the reference number 302. A layer includes cells that are contiguous in the lateral direction. A layer is a geological unit within which reservoir rock is deposited at a similar geological time and has similar rock properties. A layer can cover the reservoir model area entirely or partially. A layer can be pinched out (disappeared) in some regions of the model due to some geological phenomena, e.g., erosion (the upper layers truncate the lower layers and vice versa). A layer can be discontinuous across a fault.

The unstructured grid portion 300 also includes a region with more layers than the global grid, identified by the reference number 304. Because of different geological processes, e.g., a depositional process may be faster in one region than another. Thus, some regions may have more layers than other regions, i.e., number of layers in some regions is different from number of layers in the global grid as shown in the region 304. Grid cell size can change between layers. These situations can be modeled using local grid refinement, a technique that is familiar to persons of ordinary skill in the art.

As described above, block 104 of FIG. 1 relates to defining a virtual structured grid for an unstructured grid reservoir model. A structured grid comprises a plurality of cells and connections. Connections comprise the shared faces between cells. The defining of a virtual structured grid is explained with reference to FIG. 4 and FIG. 5.

Figure 4:
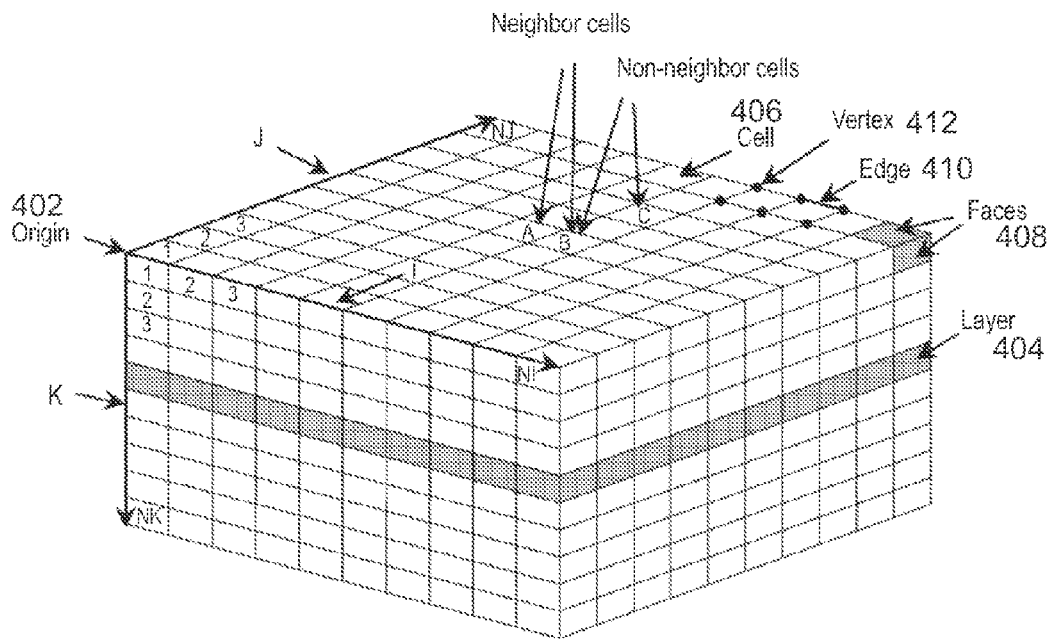
FIG. 4 is a diagram showing a portion of a structured grid in which cells have six surfaces each.

FIG. 4 is a diagram showing a portion of a structured grid 400 in which cells (for example, a cell 406) have six surfaces (faces 408) each. In the exemplary embodiment shown in FIG. 4, each face has exactly four edges 410; and each edge has exactly two vertices 412. Geometrically, a structured grid cell contains six faces, 12 edges, and eight vertices. Cells are organized using I, J, and K indices. Starting from an origin (usually at the upper-left corner shown in FIG. 4), identified by the reference number 402, cells are indexed I from 1 to NI (number of cells in I direction), J from 1 to NJ (number of cells in J direction), and K from 1 to NK (number of cells in K direction). Each cell is uniquely addressed by index (I, J, K). I and J are in the horizontal directions while K is in vertical direction. A K index is also called a layer, identified by the reference number 404, which consists of a group of cells that have the same K index. Structured grid reservoir simulators typically accept structured grids of the type described in FIG. 4 with the same or a different origin.

In the example shown in FIG. 4, each cell (for example, the cell 406) in the structured grid 400 is a repository of the reservoir properties of a sub-volume of a hydrocarbon reservoir. Examples of data that each cell is able to store include, but is not limited to, reservoir rock properties that comprise porosity, pore volume, permeability, and compressibility; fluid properties that comprise fluid components, viscosity, formation volume factors, compressibility, saturation, and relative permeability; hydrodynamic properties that comprise pressure, potential, gravity, and temperature. Additional examples include cell geometric properties that comprise length, width, thickness, depth, and volume.

A connection in a structured grid is a repository of communication properties between two cells. In an exemplary embodiment, each connection stores (without limitation) data relating to transmissibility, flux, velocity, and pressure gradient. Cells are connected through the connections that transfer physical quantities, e.g., hydrocarbons and other fluids, between cells. In an exemplary embodiment, there are two types of connections between cells: neighbor connections and non-neighbor connections. A neighbor connection, the most common connection type in the structured grid, is the connection that connects two neighbor cells which are defined as the cells that share a common face, e.g., cells A and B shown in FIG. 4. A non-neighbor connection, a less common but an important connection type in the structured grid, is the connection that connects two non-neighbor cells which are defined as the cells that do not share a common face, e.g., cells B and C shown in FIG. 4.

An exemplary embodiment of the present techniques provides a method in which a structured grid may be defined is a structuralized version of the given unstructured grid model that can be accepted and understood by the structured grid reservoir simulator engine. The unstructured grid may not be capable of being rendered geometrically using a structured grid because the geometry of the structured cells is insufficient to represent the geometry of the unstructured cells. The numbers of vertices, edges, and faces per cell are variable for the unstructured grid but constant for the structured grid. Fortunately, since geometrical information that comprises vertices, edges, and faces is optional for all structured grid reservoir simulator engines, the geometrical information is not necessary for the structured grid to be constructed, which makes structuralization of the unstructured grid reservoir model possible. As a result, the structured grid according to the present techniques becomes a structured grid without geometry (i.e. vertices, edges, and faces). This type of structured grid is referred to herein as a virtual structured grid.

The virtual structured grid has all structured grid properties except geometry. Despite not carrying geometric information, a virtual structured grid has its cells uniquely indexed using (i, j, k) in 3D or (i, j) in 2D. It is noted however that two cells which have a single index differing by one may not have any connections. All cells and connections in the virtual structured grid become virtual cells and virtual connections, respectively, because they possess no geometrical information. Similar to the structured grid described above, the virtual structured grid has a virtual origin which is the starting point of I, J, and K indices; virtual cells have their unique index (I, J, K); and virtual connections comprise virtual neighbor and non-neighbor connections. Examples of data that may be stored by each virtual cell include, without limitation, reservoir rock properties that comprise porosity, pore volume, permeability, and compressibility; fluid properties that comprise fluid components, viscosity, formation volume factors, compressibility, saturation, and relative permeability; hydrodynamic properties that comprise pressure, potential, gravity, and temperature. Further examples include, without limitation, cell geometric properties that comprise length, width, thickness, depth, and volume. Examples of data that may be carried by each virtual connection include, without limitation, transmissibility, flux, velocity, and pressure gradient.

Figure 5:
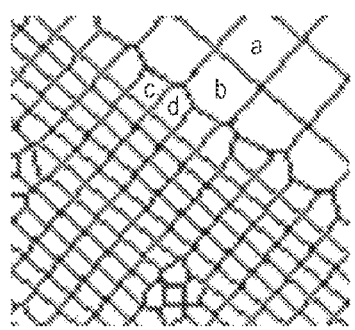
FIG. 5 is a diagram showing a portion of an unstructured grid that is suitable for conversion into a virtual structured grid.
Figure 5:
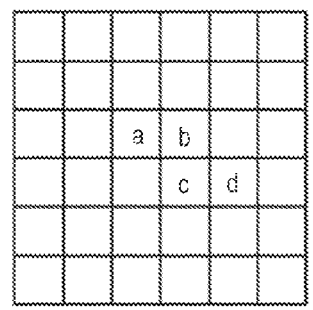

FIG. 5 is a diagram 500 showing a portion of an unstructured grid 502 that is suitable for conversion into a virtual structured grid 504 according to an exemplary embodiment of the present techniques. According to the present techniques, the definition for virtual neighbor and non-neighbor connections differs from the conventional definition. As used herein, a virtual connection is a virtual neighbor connection if the cells connected by this connection are neighbor cells both in the virtual structured grid and in the unstructured grid. Otherwise the connection is a virtual non-neighbor connection or not a connection at all. For example, the virtual connection between virtual cells a and b shown in FIG. 5 is a virtual neighbor connection because a and b are neighbor cells both in the virtual structured grid and the unstructured grid. In the same figure, the virtual connection between virtual cells b and d is a virtual non-neighbor connection because b and d in the virtual structured grid are non-neighbor virtual cells. There is no connection between virtual cells b and c even though they are neighbor cells in the virtual structured grid. The connectivity between two cells is determined by the unstructured grid. As used herein, a conventional neighbor connection can become a non-connection. However, conventional non-neighbor connections are always the non-neighbor connections according to the present techniques. The concept of connections as explained herein is employed in the preparation of a structured grid reservoir simulator input (block 110).

The virtual structured grid contains all necessary grid data of the unstructured grid reservoir model for the structured grid simulator engine to make a simulation run.

With reference to block 102 (FIG. 1), an unstructured grid reservoir model may have local grid refinement regions within the global unstructured grid. The same idea and process for the global unstructured grid described herein can be applied to each local grid refinement region. For ease of presentation, the unstructured grid used herein means the global unstructured grid in short.

Figure 6:
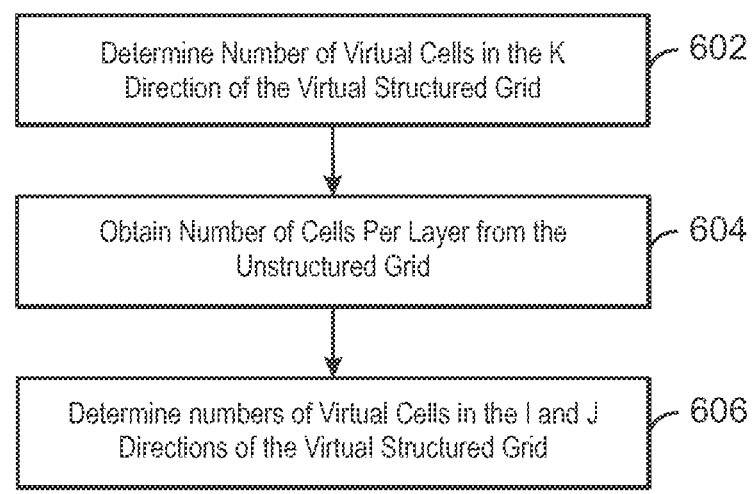
FIG. 6 is a process flow diagram showing methods for defining a virtual structured grid.

FIG. 6 is a process flow diagram 600 showing methods for defining a virtual structured grid according to exemplary embodiments of the present techniques. At block 602, a number of virtual cells in the K direction of the virtual structured grid is determined. Since the unstructured grid models used in the oil industry are structured in the vertical direction, the number of virtual cells in the K direction is the same as the number of layers in the unstructured grid model.

The number of cells per layer is obtained from the unstructured grid, as shown at block 604. The number of cells per layer (NL) in the unstructured grid may not be available directly because it depends on how to index the cells. In a known method of indexing the cells in the unstructured grid, cells are indexed by first looping over all cells in a layer within a domain, second looping over all layers within the domain, and finally looping over all domains. As a result, the number of cells per layer in the unstructured grid is not readily obtainable. According to the present techniques, one way to obtain the number of cells per layer from the unstructured grid is to divide the total number of cells in the grid by the number of layers of the grid. However, the total number of cells in the unstructured grid is not readily known because most unstructured grid viewers display active cells only. One exemplary way of finding the total number of cells in the unstructured grid is to choose a property of the unstructured grid that is present in all (active and inactive) cells, e.g., cell pore volume or bulk volume.

At block 606, numbers of virtual cells in the I and J directions of the virtual structured grid are determined. The numbers of virtual cells in the I and J directions are related to each other and cannot be determined independently. There are two objectives for determining the numbers of virtual cells in the I and J directions. The first objective is to determine the size of NI (number of virtual cells in the I direction) times NJ (number of virtual cells in the J direction) that holds the most important areas in the unstructured grid.

Figure 7:
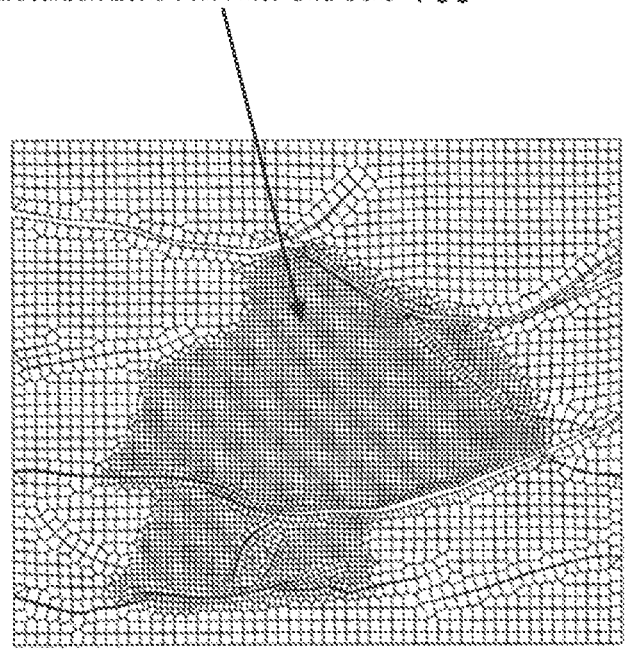
FIG. 7 is a diagram of a portion of an unstructured grid representing a hydrocarbon zone, and a corresponding portion of a virtual structured grid.
Figure 7:
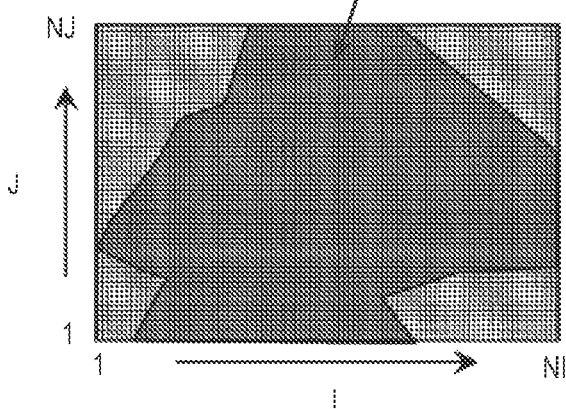

FIG. 7 is a diagram 700 of a portion of an unstructured grid 702 representing a hydrocarbon zone, and a corresponding portion of a virtual structured grid 704. The unstructured grid 702 (on the upper portion of FIG. 7) includes a hydrocarbon zone 706, in which finer grid cells are present in the areas that have the most interest for fluid flow simulation. The virtual structured grid 704 (shown on the lower portion of FIG. 7) includes a hydrocarbon zone 708 corresponding to the hydrocarbon zone 706 in the unstructured grid 702. With regard to block 606 (FIG. 6), the second objective is to make sure that the product of NI and NJ is equal to NL (number of cells per layer) determined at block 604 (FIG. 6). In some situations, e.g., when NL is a prime number, it cannot be factorized into NI by NJ because NI and NJ have to be integers. To solve the problem, a desired NI (which is believed to be the best) is chosen. NJ is then estimated using NL. One exemplary way to get NJ is to set NJ equal to one plus the quotient of NL divided by NI if the remainder is greater than 0, otherwise equals to the quotient. By doing that, number of virtual cells per layer in the virtual structured grid is equal to or greater than number of cells per layer in the unstructured grid. In this manner, the virtual structured grid is created such that it has enough cells to hold the unstructured grid cells.

With respect to block 106 of FIG. 1 (alignment of the unstructured grid with the virtual structured grid), when the remainder of NL (number of cells per layer in the unstructured grid) divided by NI (number of virtual cells in I direction of the virtual structured grid) is greater than zero, the number of cells per layer in the virtual structured grid is greater than number of cells per layer in the unstructured grid. That is to say, total number of virtual cells in the virtual structured grid is greater than total number of cells in the unstructured grid, which creates the surplus virtual cells that cannot be linked to any of the cells in the unstructured grid. In other words, the virtual structured grid does not align with the unstructured grid. In order to make the two grids consistent, alignment between the unstructured grid and the virtual structured grid is needed.

According to the present techniques, dummy cells may be added in the unstructured grid such that a total number of virtual cells in the virtual structured grid is equal to total number of cells in the unstructured grid. It may be that the surplus virtual cells can be treated as inactive cells (cells will be ignored during simulation) and the unstructured grid can be kept intact. In this method, however, it may be necessary to modify the structured reservoir simulator engine. Moreover, simulation results may be difficult to map back to the unstructured grid. Adding dummy cells in the unstructured grid does not require modifying the structured grid reservoir simulator and the simulation results can be mapped back to the unstructured grid automatically. This is explained with respect to the discussion of block 114 (FIG. 1) below.

Figure 8:
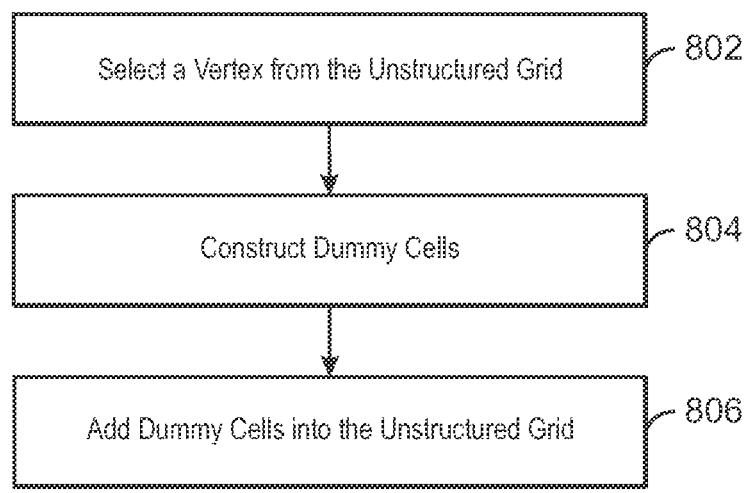
FIG. 8 is a process flow diagram showing methods of defining dummy cells in an unstructured grid.

FIG. 8 is a process flow diagram 800 showing methods of defining dummy cells in an unstructured grid according to exemplary embodiments of the present techniques. As explained herein, dummy cells in the unstructured grid are cells that have no volume and are visually invisible in an unstructured grid 3D viewer. One way to make dummy cells without volume and visually invisible is to use a single point to represent the dummy cells. That is to say, all dummy cells are represented as a single point in the unstructured grid.

At block 802, a vertex is selected from an unstructured grid. To make the dummy cells invisible in a viewer, the point used to construct the dummy cells is desirably one of the vertices of the unstructured grid. Any vertex in the unstructured grid can be selected to construct the dummy cells. However, the simplest way is to select the first vertex from the unstructured grid data file. The vertex selected may be used as the point to construct the dummy cells.

At block 804, dummy cells are constructed. As described herein, a cell comprises faces, and faces comprise edges. An edge comprises points. After the vertex is selected, an edge is constructed using the vertex as the two points of the edge even though the two points are identical. In an exemplary embodiment, four copies of the edge are made and a face is created using the four identical edges. Similarly, once the face is constructed, six copies of the face may be made. A cell may be created using the six identical faces. Finally, if n dummy cells are needed, n copies of the dummy cells are made. As a result, all dummy cells are identical to the selected vertex.

At block 806, the dummy cells created at block 804 are added into the unstructured grid. According to the format of the unstructured grid data file, the dummy cells may be appended to the last cell of the unstructured grid file. For example, if the number of dummy cells is n, then n cells may be added into the unstructured grid data file. At the same time, the face and edge used to construct the dummy cells may also be appended to the last face and edge of the unstructured grid, respectively.

Figure 9:
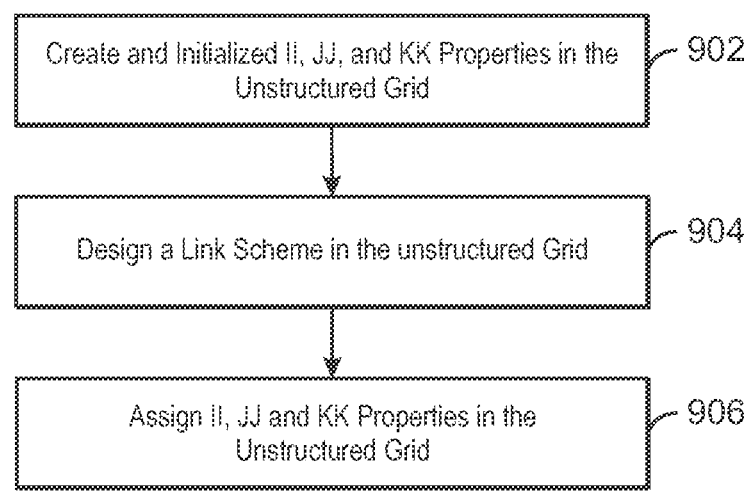
FIG. 9 is a process flow diagram showing methods of creating and initializing properties in an unstructured grid to hold a virtual cell index.

With respect to representing a virtual structured grid in an unstructured grid reservoir model referred to at block 108 (FIG. 1), FIG. 9 is a process flow diagram 900 showing methods of creating and initializing properties in an unstructured grid to hold a virtual cell index according to exemplary embodiments of the present techniques. Once the virtual structured grid is defined, the next step is to represent the virtual structured grid in the unstructured grid. Each virtual cell in the virtual structured grid needs to be linked to only one cell in the unstructured grid. This is a one-to-one link because every virtual cell in the virtual structured grid is mapped to at most one cell of the unstructured grid. There are many ways to link between the virtual structured grid and the unstructured grid. A link method according to an exemplary embodiment of the present techniques is to represent the virtual structured grid in the unstructured grid. This method includes three steps, as shown in FIG. 9.

At block 902, II, JJ, and KK properties are created in the unstructured grid to hold virtual cell indices (I, J, K). Using an unstructured grid viewer, three new cell properties for each cell in the unstructured grid may be used to hold its corresponding virtual cell I, J, and K indices. The three properties may be referred to as II, JJ, and KK, or other convenient names. One reason to avoid directly using I, J, and K as property names is that these names may be the reserved names in the unstructured grid viewer. The three new properties are desirably available or defined on all (active and inactive) cells in the unstructured grid. Normally, because unstructured grid viewers display active cells only, when a new cell property is created, the new property is only available in the active cells. In order to make all cells available for the three new properties, both active and inactive cells may be displayed in the 3D viewer. II, JJ, and KK may be created for all cells in the unstructured grid. After II, JJ, and KK have been created, they are initialized with value 0, i.e., each cell is assigned 0 for all II, JJ, and KK properties.

At block 904, a link scheme is designed in the unstructured grid. Since the virtual structured grid and the unstructured grid have the same layering system, the layer index in the virtual structured grid is the same as the layer index in the unstructured grid. As a result, mapping K in the virtual structured grid to KK in the unstructured grid is not complex. No special design is needed for KK. However, before assigning virtual cell index I or J to each cell in the unstructured grid for properties II and JJ, analysis of the organization of the cells in the unstructured grid is needed.

The unstructured grid typically includes unstructured or structured cells or both that have been defined and described at block 102 (FIG. 1). For a computationally efficient unstructured grid model, structured cells may be used in the regions where geologic structures are relatively smooth while unstructured cells are applied in the regions where geologic structures are unsmooth or discontinuous (e.g., faults). Structured cells may be used in areas of interest, e.g., a hydrocarbon zone, with fine grid cells as shown in the unstructured grid portion 702 (FIG. 7). Many ways may be used to map between the virtual structured grid and the unstructured grid. It is desirable, however, to choose ways that deliver a computationally efficient virtual structured grid. One way to achieve this goal is to minimize the number of virtual non-neighbor connections or maximize the number of neighbor connections between the virtual cells in the virtual structured grid. Because most of the neighbor connections between virtual cells in the virtual structured grid come from the structured cells in the unstructured grid, if the structured cells of the unstructured grid may be preserved as much as possible in the virtual structured grid, the number of virtual non-neighbor connections can be minimized and the number of virtual neighbor connections can be maximized. Therefore, a desirable goal is to map as much as possible of the structured cells of the unstructured grid into the virtual structured grid. To achieve this goal, it is desirable to find an area (or areas) in the unstructured grid where the structured cells are densely populated. Once these "structured" areas of the unstructured grid have been identified, the areas are prioritized based on their importance with respect to the transformation to the virtual structured grid.

There may be some cases in which no "structured" areas can be found. In these cases, it may be desirable to focus on areas of the unstructured grid that are important for fluid flow, to prioritize those areas, and to assign each area with the virtual structured grid indices based on its priority. These types of unstructured grid models are generally less computationally efficient than the unstructured grid models that contain structured cells.

At block 906, II, JJ, and KK properties are assigned in the unstructured grid. In an exemplary embodiment, assigning II, JJ, and KK for each cell in the unstructured grid may include a manual process and an automatic process. The manual portion of the process may be performed with the aid of an unstructured grid viewer while the automatic process may be done and instructed by a computer.

Figure 10:
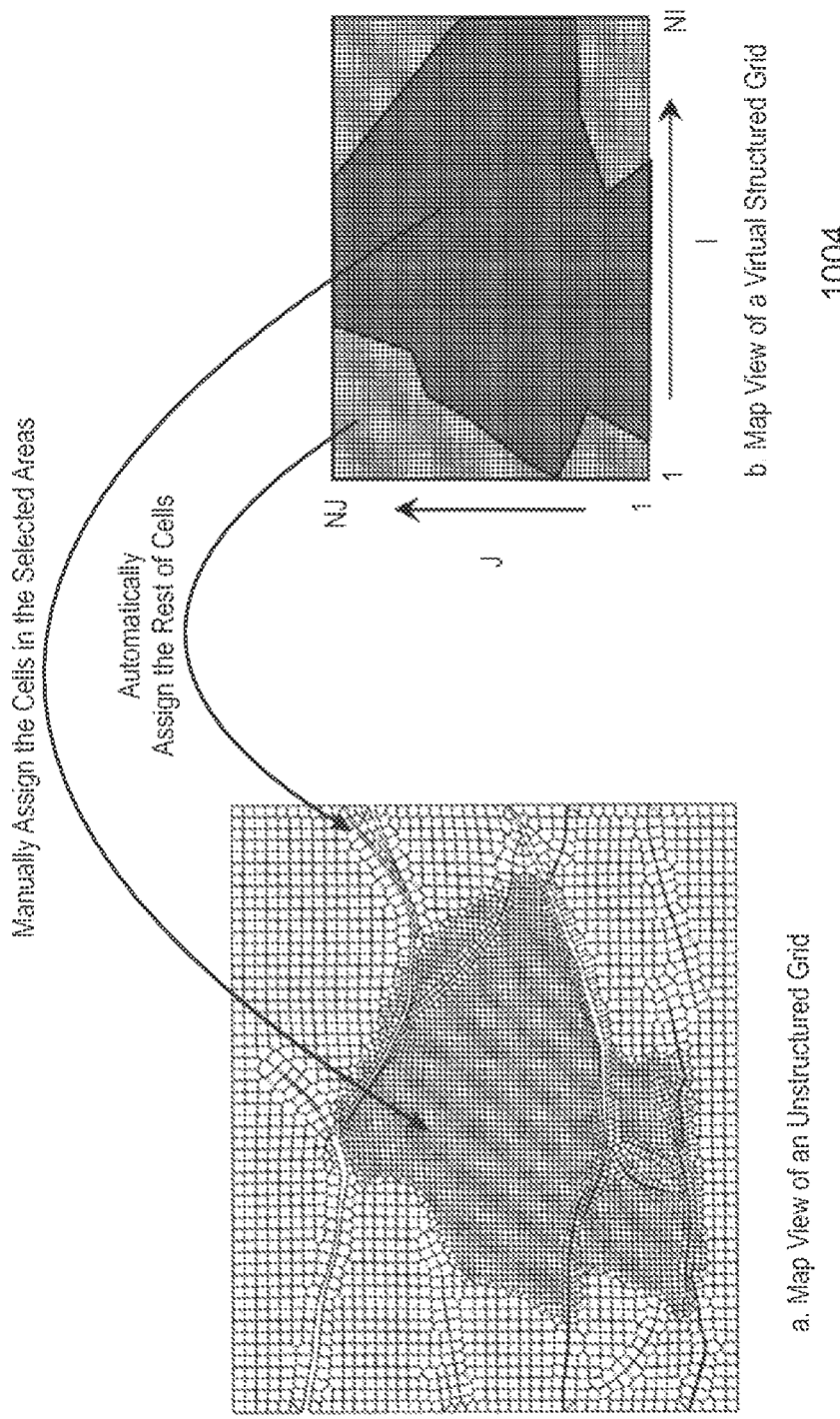
FIG. 10 is a diagram showing a map view of an unstructured grid and a corresponding virtual structured grid.

FIG. 10 is a diagram 1000 showing a map view of an unstructured grid 1002 and a corresponding virtual structured grid 1004. Areas of interest may be identified visually and the assignment for these areas may be done manually. For other areas deemed less important, the assignment may be performed automatically. By way of example, cells in a hydrocarbon zone in the unstructured grid portion 1002 may be manually aligned because computation of fluid flow in the hydrocarbon region is of interest and relative importance. Cells that are remote from the hydrocarbon zone may be automatically aligned.

Figure 11:
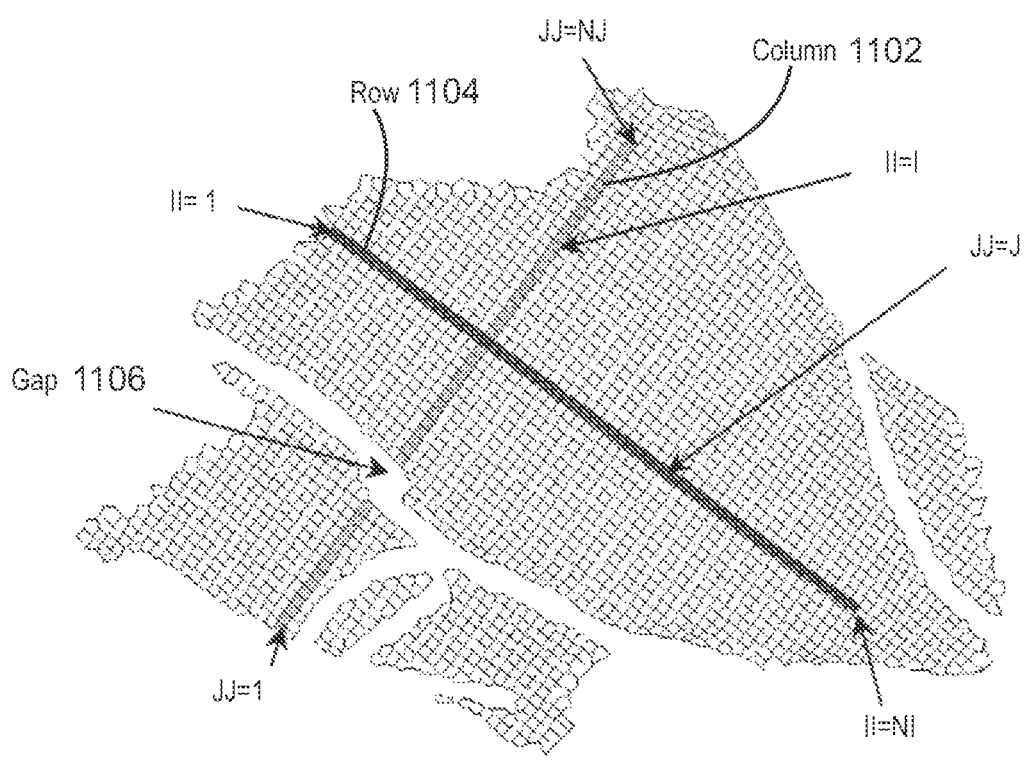
FIG. 11 is a diagram of an unstructured grid useful in explaining a manual portion of a cell assignment process.

FIG. 11 is a diagram of an unstructured grid 1100 useful in explaining a manual portion of a cell assignment process according to an exemplary embodiment of the present techniques. In a manual process, the assigned II and JJ values for the selected cells in the unstructured grid 1100 are desirably within the ranges of virtual cell indices I and J, respectively. That is to say, II values are bounded between 1 and NI and JJ values between 1 and NJ. Assigning values of II and JJ is not an independent process. Moreover, assigning II needs considering JJ, and vice versa. During assigning II, a column of cells in which their JJ values are bounded between 1 and NJ. In other words, the number of cells per layer in this column cannot be greater than NJ. For the manual process, the first selected column of cells is the cells where II=1. The column can be selected in the unstructured grid viewer using a function of "threshold" or "slice". All layers should be available in this selected column. The value of 1 is then assigned to all the cells in this selected column. The same process is applied to the columns with II values from 2 to NI. For example, when II=I, all cells in a selected column 1102 (shown as a lightly shaded bar in FIG. 11) are assigned the value of I. Gaps in the selected column are allowed. All cells in the gaps maintain their original value of II, i.e. 0.

The same procedure of assigning II may be applied to assigning JJ. During assigning JJ, a row of cells in which their II values are bounded between 1 and NI. The number of cells per layer in this row cannot be greater than NI. The first selected row of cells is the cells where JJ=1. Similarly, the row can be selected in the unstructured grid viewer using the function of "threshold" or "slice". All layers should be available in this selected row. Then, the value of 1 is assigned to all the cells in this selected row. The same process is applied to the rows with JJ values from 2 to NJ. When JJ=J, all cells in a selected row 1104 (shown as a darkly shaded bar in FIG. 11) are assigned the value of J. Gaps in the selected row, such as a gap 1106, are allowed. All cells in the gaps maintain their original value of JJ, i.e. 0.

Figure 12:
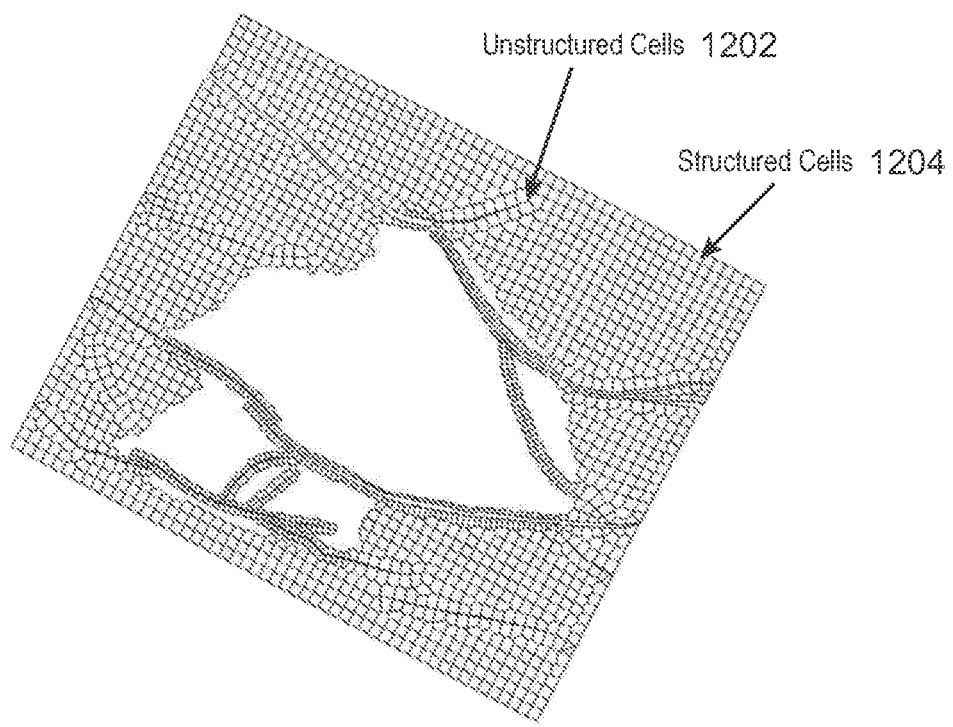
FIG. 12 is a diagram of an unstructured grid having unstructured cells and structured cells.

FIG. 12 is a diagram of an unstructured grid 1200 having unstructured cells and structured cells according to an exemplary embodiment of the present techniques. The diagram shown in FIG. 12 is useful in explaining an automatic alignment process that may take place after a manual alignment process described with reference to FIG. 11. After the manual assignment process is finished, the rest of structured and unstructured cells in the unstructured grid as shown in FIG. 12 may be automatically assigned values of II and JJ using a computer code. Because the cell index for the unstructured grid is typically a one-dimensional array, the exemplary pseudo code shown in Table 1 can be used to assign II and JJ values for the rest of cells after the manual assignment.

TABLE 1

Example of pseudo code for performing automatic alignment.

```
Read cell ID and store it in ID[number of cells];
Read layer ID and store it in LayerID[number of cells];
Read manually assigned II and JJ
    and store them in II[number of cells], JJ[number of cells];
Define KK[number of cells];
Assign layer ID to KK
Loop (i = 1 to number of cells)
{
        KK[i] = LayerID[i];
}
Define unassigned virtual cells in layer 1
    I[number of unassigned cells], J[number of unassigned cells];
k = 0;
Loop (j = 1 to NJ)
{
        Loop(i = 1 to NI)
        {
            If(the cell is unassigned)
            {
                k = k + 1;
                I[k] = i;
                J[k] = j;
            }
        }
}
Assign virtual cell I and J to II and JJ;
Define index for each layer
    LayerIndex[NK];
Initial LayerIndex array;
Loop (i = 1 to NK)
{
        LayerIndex[i] = 0;
}
Loop (i=1 to number of cells)
{
        k = KK[i];
        if(the cell is unassigned)
        {
            LayerIndex[k] = LayerIndex[k] + 1;
            II[i] = I[LayerIndex[k]];
            JJ[i] = J[LayerIndex[k]];
        }
}
```

Figure 13:
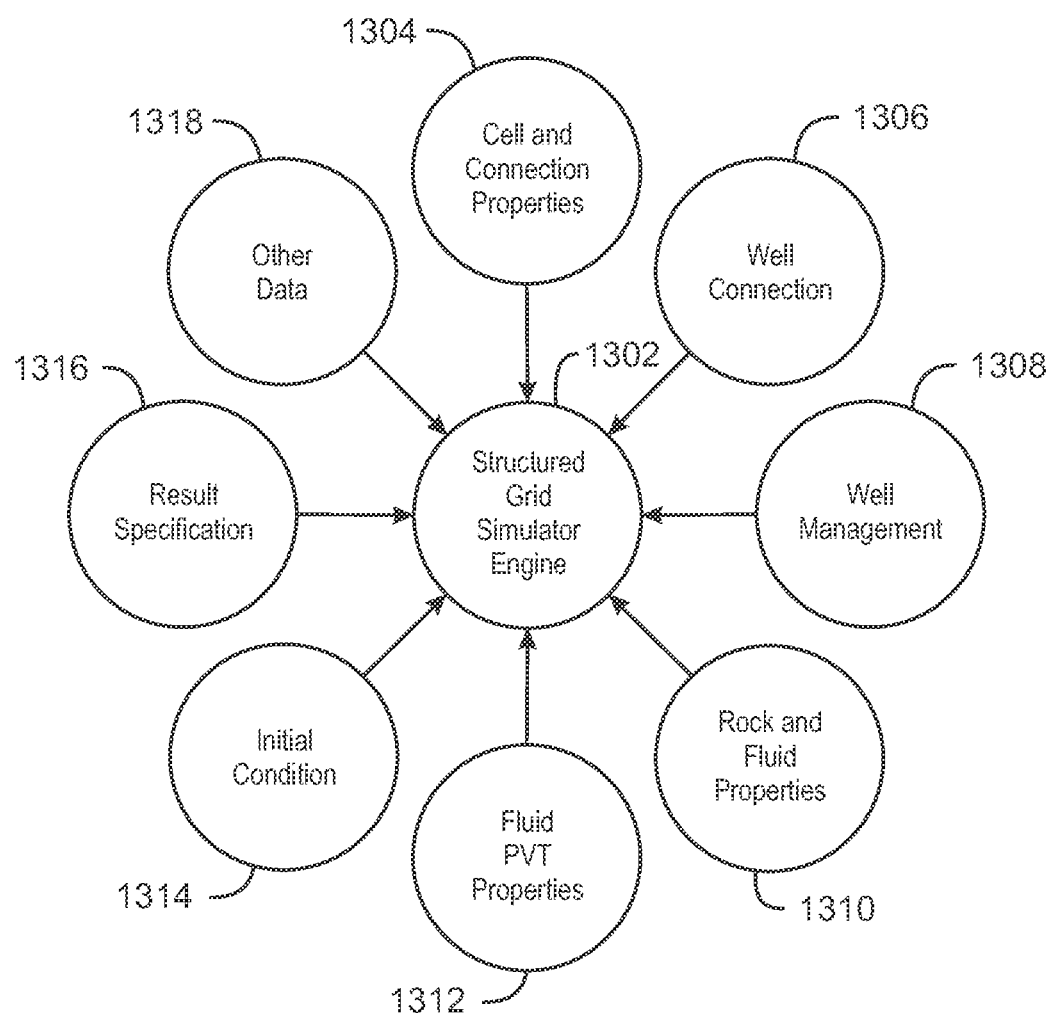
FIG. 13 is a block diagram of a reservoir simulator.

With respect to the preparation of structured grid simulator input referred to at block 110 (FIG. 1), FIG. 13 is a block diagram 1300 of a reservoir simulator according to an exemplary embodiment of the present techniques. The reservoir simulator includes a structured grid simulator engine 1302. Once the link between the virtual structured grid and the unstructured grid has been created, entire input data may be constructed for the structured grid reservoir simulator 1300. Input data required to run the reservoir simulator 1300 comprises grid cell/connection properties 1304, well connection properties 1306, well management actions 1308, rock/fluid properties 1310, fluid PVT properties 1312, initial conditions 1314, and a result specification 1316. In addition, other data 1318 may also be used, depending on the specific application.

An exemplary embodiment relates to eight independent steps of preparing input data. As a first step, grid cell and connection properties may be prepared. The structured grid reservoir simulator engine 1302 may take as input the structured grid properties that comprise grid geometry, porosity, permeability, fluid saturations, and geologic associations. Using these properties, the simulator engine 1302 calculates pore volume for each cell and transmissibility between cells for numerical simulations. However, the structured grid reservoir simulator engine 1302 may misunderstand the virtual structured grid created in this invention, because it is not a purely structured grid as described at block 1304 (FIG. 1). In order to make the data from the original unstructured grid understandable by the structured reservoir simulator engine 1302, four steps as shown in FIG. 14 may be performed.

Figure 14:
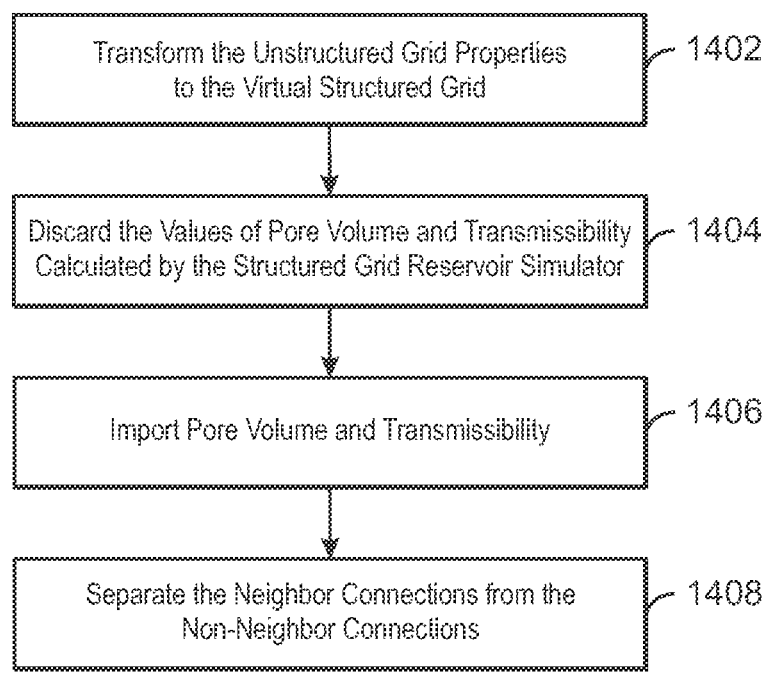
FIG. 14 is a process flow diagram showing methods of transforming data from an unstructured grid to be used in a virtual structured grid.

FIG. 14 is a process flow diagram 1400 showing methods of transforming data from an unstructured grid to be used in a virtual structured grid. At block 1402, the grid properties of the unstructured grid are transformed to the virtual structured grid. Using the link created at block 108 (FIG. 1), unstructured grid properties that comprise dx, dy, dz, depth, porosity, permeability, pore volume, and transmissibility (to name a few examples) can be mapped to the virtual structured grid. Instead of inputting a structured grid, the virtual structured grid may be inputted. Because no detailed geometry that comprises cell vertices, edges, and faces is present or needed in the virtual structured grid, the input grid format for the structured grid simulator may be a block center format rather than a corner point format. The block center format does not require detailed grid geometry information while the corner point format requires detailed grid geometry.

At block 1404, values of pore volume and transmissibility calculated by the structured grid reservoir simulator are discarded. These values will have been calculated incorrectly because there is no detailed grid geometry information in the virtual structured grid. According to the present techniques, the pore volume and transmissibility calculated by the structured reservoir simulator engine may be set to zero (0). Pre-calculated values from the unstructured grid reservoir model may be substituted for these values.

Pore volume and transmissibility data may be imported, as shown at block 1406. According to an exemplary embodiment, transmissibility may be imported via non-neighbor connections.

As shown at block 1408, neighbor connections are separated from non-neighbor connections. The use of only non-neighbor connections will cause the structured grid reservoir simulator to be computationally inefficient. Moreover, some known structured grid reservoir simulators have the capability to automatically separate the inputted neighbor connections from the non-neighbor connections. However, if the structured grid simulator has no such capability, separating neighbor connections from non-neighbor connections is needed. One exemplary way to do this is to loop over all connections, filter out neighbor connections in I, J, and K directions, respectively, and then make four separate connection files. In an exemplary embodiment, three of the files are for neighbor connections and one is for non-neighbor connections. The three neighbor connection files contain connections in I, J, and K directions, separately.

Returning to the discussion of the eight steps of an exemplary process of preparing input data, a second step comprises preparing well connection properties. Well connections are a collection of cells that are penetrated by the wells. Each well connection represents a cell that is connected to a well. The properties of a well connection comprises cell index (I, J, K), transmissibility between well and cell, skin, and well diameter. I, J, and K here are indices for the virtual structured grid. The link between the virtual structured grid and the unstructured grid created at block 108 (FIG. 1) may be used to transform the well connections from the unstructured grid to the virtual structured grid for the structured grid reservoir simulator engine 1302 (FIG. 13).

A third step in an exemplary process of preparing input data is preparing well management data. Well management data may include well production/injection constraints and limits, well production/injection strategies, flow in wellbores and network pipelines, network constraints and limits and the like. Because well management is independent of the reservoir model grid, well management data may desirably be prepared based on the format of the structured grid reservoir simulator.

Preparing rock and fluid properties comprises a fourth step in an exemplary process of preparing input data. Rock/fluid data comprises relative permeability curves, capillary pressure curves, endpoint saturations, and rock compressibility. Since relative permeability curves and capillary pressure curves are generally independent of the reservoir model grid, relative permeability and capillary pressure data should be prepared based on the format of the structured grid reservoir simulator. Because endpoint saturations and rock compressibility may be dependent on the reservoir model grid, the link between the virtual structured grid and the unstructured grid created at block 108 (FIG. 1) may be used to transform them from the unstructured grid to the virtual structured grid.

A fifth step in an exemplary process of preparing input data comprises preparing fluid PVT properties. PVT data comprises saturation pressure, fluid compressibility, formation volume factors, viscosity, fluid compositions, fluid ratios, fluid density, and equation of state. Because fluid PVT properties are independent of the reservoir model grid, fluid PVT data may be prepared based on the format of the structured grid reservoir simulator.

A sixth step in an exemplary process of preparing input data comprises preparing initial condition data. Initial condition data comprises pressure, saturations, components, temperature, fluid contacts at the initial reservoir condition and the like. If the model is initialized by gravity equilibrium, the initialization process is independent of the reservoir model grid. At this situation, the reservoir model may be initialized like a regular structured grid model. However, if the model is initialized by non-gravity equilibrium, the initialization process is dependent on the reservoir model grid. In this situation, the link between the virtual structured grid and the unstructured grid created at block 108 (FIG. 1) may be used to transform initial condition data from the unstructured grid to the virtual structured grid.

A seventh step in an exemplary process of preparing input data comprises preparing a simulation result specification. A simulation result specification may comprise selections of the output and output frequency of reservoir and well dynamic properties. Because the selection process is independent of the reservoir model grid, simulation result specification is performed based on the format of the structured grid reservoir simulator.

An eighth step in an exemplary process of preparing input data comprises preparing other data. Other data comprises aquifer data that can be dependent on or independent of the reservoir model grid. Aquifer data is familiar to persons of ordinary skill in the art. If the aquifer data is dependent on the grid, the link between the virtual structured grid and the unstructured grid created at block 108 (FIG. 1) may be used to transform aquifer data from the unstructured grid to the virtual structured grid. Otherwise, aquifer data preparation is like any other standard aquifer data preparation for the structured grid simulator.

Returning to the discussion of providing a reservoir simulation according to FIG. 1, at block 112, the structured grid simulator is performed. Once all input data for the structured grid reservoir simulator have been prepared, the structured grid reservoir simulator can be run in the same manner as any other standard structured grid reservoir model.

At block 114, simulation results of the unstructured grid reservoir model are displayed. Simulation results may comprise well/facility results and 3D simulation results. According to an exemplary embodiment, displaying the well/facility results for the virtual structured grid model may be done in the same manner as displaying any other standard structured grid model. However, displaying the 3D simulation results of the virtual structured grid that comprise pressure, fluid saturations, components, and other dynamic properties is different, because the output from the structured grid reservoir simulator is in the virtual structured grid format. Based on the definition at block 104 (FIG. 1), the virtual structured grid is a structuralized unstructured grid. The virtual structured grid is structured for computation but unstructured for visualization. As a result, a standard structured grid viewer cannot be used to visualize the model. To overcome this, a backward link may be used to transform the 3D simulation results from the virtual structured grid to the unstructured grid for viewing.

According to an exemplary embodiment, a backward link from the virtual structured grid to the unstructured grid can be created using the following formula:

$$VirtualCellID = II + (JJ-1)*NI + (KK-1)*NI*NJ$$

where VirtualCellID is a virtual structured grid cell ID in one dimension. II, JJ, and KK are the link functions (arrays) created at block 108 (FIG. 1). The pseudo code shown below in Table 2 may be used to demonstrate creation of the backward link.

TABLE 2

Pseudo code for providing a backward link to an unstructured grid.

Define VirtualCellID[number of cells];
Read II[number of cells], JJ[number of cells], KK[number of cells];
Loop (i=1 to number of cells)
{
    VirtualCellID[i] = II[i] + (JJ[i] − 1) * NI + (KK[i] − 1) * NI *NJ;
}

Figure 15:
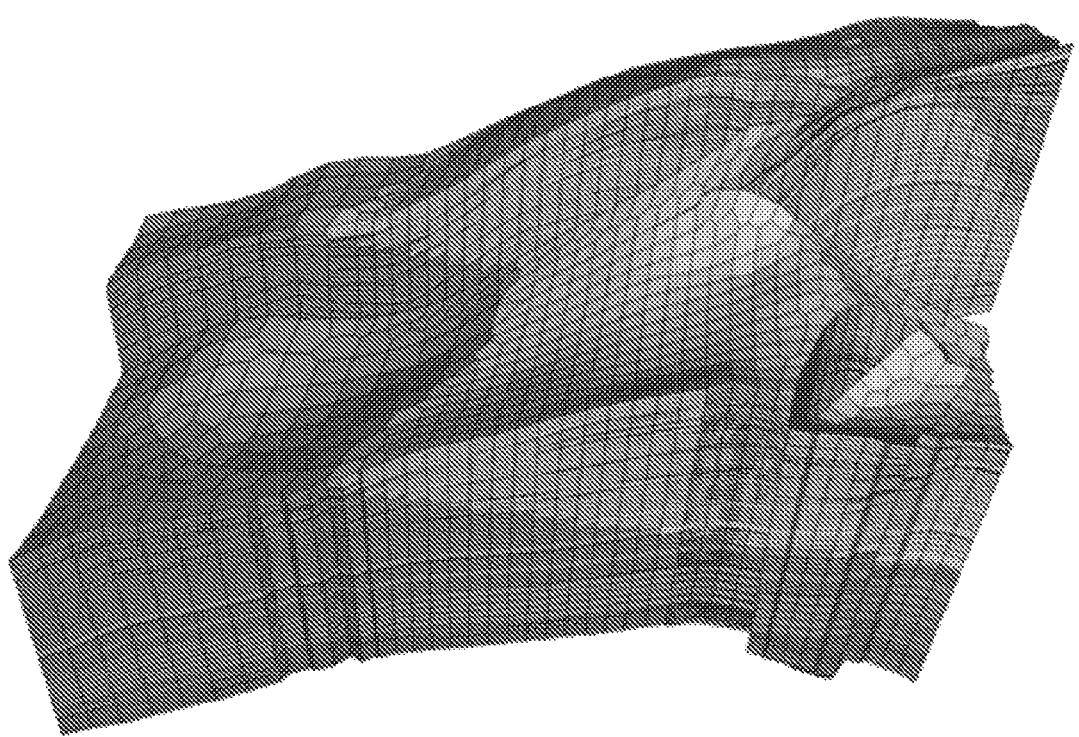
FIG. 15 is a diagram of an unstructured grid mapped backwards from a virtual structured grid.

FIG. 15 is a diagram of an unstructured grid 1500 mapped backwards from a virtual structured grid according to an exemplary embodiment of the present techniques. In the pseudo code set out in Table 2, VirtualCellID automatically maps the 3D simulation results backward from the virtual structured grid to the unstructured grid. Therefore, the 3D simulation results from the structured grid reservoir simulator can be displayed in the unstructured grid viewer. FIG. 15 shows an example of a simulation property of the virtual structured grid displayed using the unstructured grid viewer.

Figure 16:
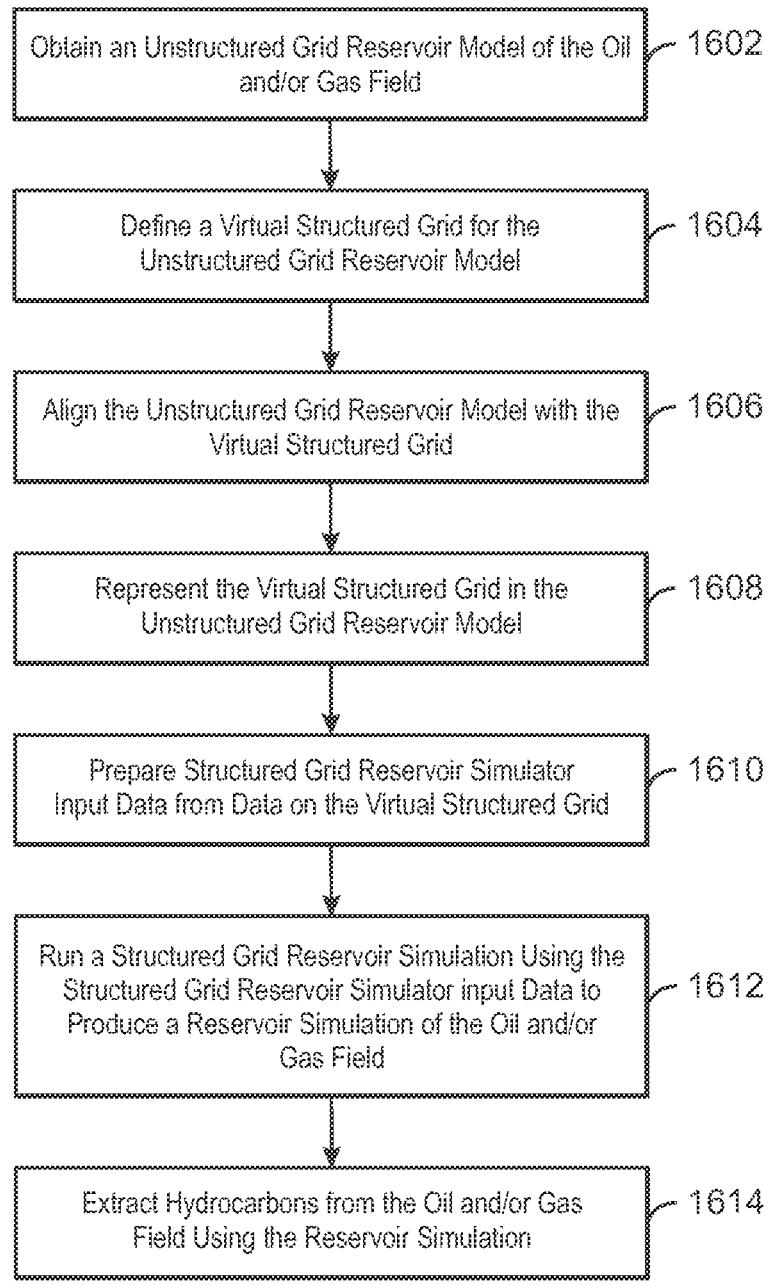
FIG. 16 is a process flow diagram showing methods for producing hydrocarbons from an oil and/or gas field.

FIG. 16 is a process flow diagram showing exemplary methods 1600 for producing hydrocarbons from an oil and/or gas field according to exemplary embodiments of the present techniques. The methods 1600 for producing hydrocarbons employs a reservoir simulation of the oil and/or gas field.

At block 1602, an unstructured grid reservoir model of the oil and/or gas field is obtained. A virtual structured grid is defined for the unstructured grid reservoir model, as shown at block 1604. At block 1606, the unstructured grid reservoir model is aligned with the virtual structured grid.

The virtual structured grid is represented in the unstructured grid reservoir model, as shown at block 1608. At block 1610, structured grid reservoir simulator input data is prepared from data on the virtual structured grid. A structured grid reservoir simulation is then performed using the structured grid reservoir simulator input data, as shown at block 1612. The result of the structured grid reservoir simulation is a reservoir simulation of the oil and/or gas field. According to an exemplary embodiment, a visualization of the reservoir simulation may be prepared. At block 1614, hydrocarbons are extracted from the oil and/or gas field using the reservoir simulation.

Figure 17:
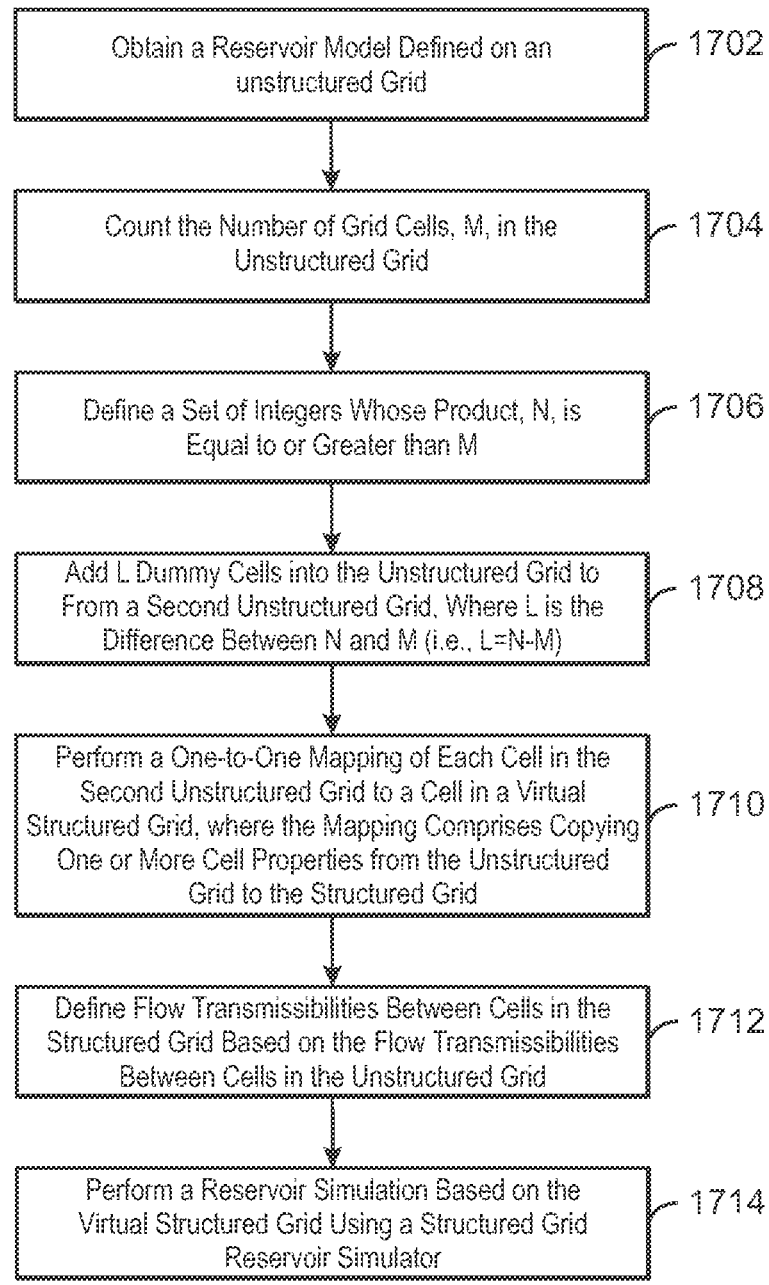
FIG. 17 is a process flow diagram showing methods of performing a reservoir simulation.

FIG. 17 is a process flow diagram showing methods 1700 of performing a reservoir simulation according to exemplary embodiments of the present techniques. At block 1702, a reservoir model defined on an unstructured grid is obtained. The number of grid cells, M, in the unstructured grid is counted, as shown at block 1704.

At block 1706, a set of integers whose product, N, is equal to or greater than M is defined. Dummy cells are added into the unstructured grid to form a second unstructured grid, where L is the difference between N and M (i.e., L=N−M), as shown at block 1708. At block 1710, a one-to-one mapping of each cell in the second unstructured grid to a cell in a virtual structured grid is performed. In an exemplary embodiment, the mapping comprises copying one or more cell properties from the unstructured grid to the structured grid.

Flow transmissibilities between cells in the structured grid may be defined based on the flow transmissibilities between cells in the unstructured grid, as shown at block 1712. At block 1714, a reservoir simulation is performed based on the virtual structured grid using a structured grid reservoir simulator.

Figure 18:
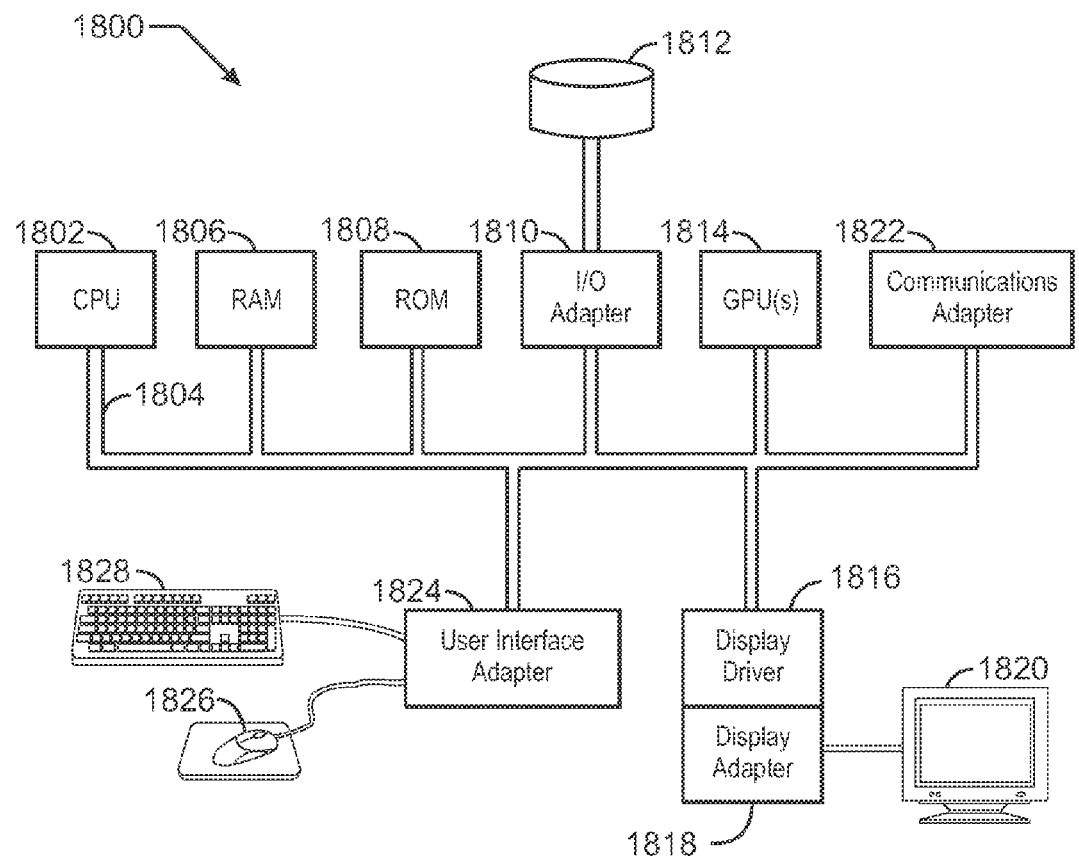
FIG. 18 is a block diagram of computer systems that may be used to perform methods for summarizing data corresponding to a property of interest.

FIG. 18 is a block diagram of computer systems that may be used to perform a method for summarizing data corresponding to a property of interest on an unstructured grid according to exemplary embodiments of the present techniques. The computer system is generally referred to by the reference number 1800. A central processing unit (CPU) 1802 is coupled to system bus 1804. The CPU 1802 may be any general-purpose CPU, although other types of architectures of CPU 1802 (or other components of exemplary system 1800) may be used as long as CPU 1802 (and other components of system 1800) supports the inventive operations as described herein. Those of ordinary skill in the art will appreciate that, while only a single CPU 1802 is shown in FIG. 18, additional CPUs may be present. Moreover, the computer system 1800 may comprise a networked, multi-processor computer system. The CPU 1802 may execute the various logical instructions according to various exemplary embodiments. For example, the CPU 1802 may execute machine-level instructions for performing processing according to the operational flow described above in conjunction with FIG. 1 or FIG. 16.

The computer system 1800 may also include computer components such as computer-readable media. Examples of computer-readable media include a random access memory (RAM) 1806, which may be SRAM, DRAM, SDRAM, or the like. The computer system 1800 may also include additional computer-readable media such as a read-only memory (ROM) 1808, which may be PROM, EPROM, EEPROM, or the like. RAM 1806 and ROM 1808 hold user and system data and programs, as is known in the art. The computer system 1800 may also include an input/output (I/O) adapter 1810, a communications adapter 1822, a user interface adapter 1824, and a display adapter 1818. In an exemplary embodiment of the present techniques, the display adapted 1818 may be adapted to provide a 3D representation of a 3D earth model. Moreover, an exemplary embodiment of the display adapter 1818 may comprise a visualization engine that is adapted to provide a visualization of extracted data. The I/O adapter 1810, the user interface adapter 1824, and/or communications adapter 1822 may, in certain embodiments, enable a user to interact with computer system 1800 in order to input information.

The I/O adapter 1810 preferably connects a storage device (s) 1812, such as one or more of hard drive, compact disc (CD) drive, floppy disk drive, tape drive, etc. to computer system 1800. The storage device(s) may be used when RAM 1806 is insufficient for the memory requirements associated with storing data for operations of embodiments of the present techniques. The data storage of the computer system 1800 may be used for storing information and/or other data used or generated as disclosed herein.

The computer system 1800 may comprise one or more graphics processing units (GPU(s)) 1814 to perform graphics processing. Moreover, the GPU(s) 1814 may be adapted to provide a visualization useful in performing a well planning process according to the present techniques. The GPU(s) 1814 may communicate via a display driver 1816 with a display adapter 1818. The display adapter 1818 may produce a visualization on a display device 1820. Moreover, the display device 1820 may be used to display information or a representation pertaining to a portion of a subsurface region under analysis, such as displaying a generated well path, according to certain exemplary embodiments.

A user interface adapter 1824 may be used to couple user input devices. For example, the user interface adapter 1824 may connect devices such as a pointing device 1826, a keyboard 1828, and/or output devices to the computer system 1800.

The architecture of system 1800 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

An exemplary embodiment of the present techniques facilitates the creation of many maps summarizing multiple zones and properties in a single execution. Furthermore, an exemplary embodiment provides the capability for the user to compare the maps generated from an unstructured grid to that generated from a separate structured or unstructured model. Properties are transferred between the two maps using one of a plurality of methods including nearest neighbor or area containment lookup algorithms prior to analysis. Potential analysis tasks include differencing or ratios of the mapped properties from the different models. Additionally, a separate, but related tool provides for the resulting output of the model zone summarization to be a table of values.

The present techniques may be susceptible to various modifications and alternative forms, and the exemplary embodiments discussed above have been shown only by way of example. However, the present techniques are not intended to be limited to the particular embodiments disclosed herein. Indeed, the present techniques include all alternatives, modifications, and equivalents falling within the spirit and scope of the appended claims.

What is claimed is:

1. A method for producing hydrocarbons from an oil and/or gas field using a reservoir simulation of the oil and/or gas field, the method comprising:
obtaining an unstructured grid reservoir model comprising a reservoir model discretized on an unstructured grid, the reservoir model representing the oil and/or gas field;
defining a virtual structured grid for the unstructured grid reservoir model wherein the virtual structured grid has no geometrical properties;
aligning the unstructured grid with the virtual structured grid comprising the addition of cells to the unstructured grid so to make the unstructured grid and virtual structured grid have the same number of cells;
representing the virtual structured grid in the unstructured grid using a one-to-one correspondence between cells in the unstructured grid and virtual structured grid;
preparing structured grid reservoir simulator input data comprising reservoir model data assigned to the virtual structured grid based on reservoir model data in the unstructured grid model;
running a structured grid reservoir simulation using the structured grid reservoir simulator input data to produce a reservoir simulation of the oil and/or gas field;
performing a backward mapping of the reservoir simulation to the unstructured grid reservoir model to create a modified unstructured grid reservoir model; and
extracting hydrocarbons from the oil and/or gas field using the modified unstructured grid reservoir model.

2. The method recited in claim 1, comprising providing a visualization of a property of interest based on the structured grid reservoir simulation.

3. The method recited in claim 1, wherein the unstructured reservoir model comprises structured cells and unstructured cells.

4. The method recited in claim 1, wherein defining the virtual structured grid comprises: determining a number of virtual cells in a K direction of the virtual structured grid; obtaining a number of cells per layer from the unstructured grid reservoir model; and determining numbers of virtual cells in an I direction and a J direction of the virtual structured grid.

5. The method recited in claim 1, wherein a region of the unstructured grid reservoir model representing an area of interest is defined by cells of a relatively finer grid relative to another region of the unstructured grid reservoir model; wherein the cells of the relatively finer grid are in the area of interest having the most significance for fluid flow simulation.

6. The method recited in claim 1, wherein aligning the unstructured grid reservoir model with the virtual structured grid comprises:
selecting a vertex from the unstructured grid reservoir model; constructing a plurality of dummy cells; and
adding the plurality of dummy cells to the unstructured grid reservoir model, the plurality of dummy cells comprising a number such that a total number of virtual cells in the virtual structured grid is equal to total number of cells in the unstructured grid reservoir model after the plurality of dummy cells are added to the unstructured grid reservoir model.

7. The method recited in claim 1, wherein a neighbor connection comprising a repository of communication properties exists between two neighboring cells in the virtual structured grid.

8. The method recited in claim 1, wherein a non-neighbor connection comprising a repository of communication properties exists between two non-neighboring cells in the virtual structured grid.

9. The method recited in claim 1, wherein each cell in the virtual structured grid stores reservoir rock properties.

10. The method recited in claim 1, wherein representing a virtual structured grid in an unstructured grid reservoir model comprises:
creating II, JJ and KK properties in the unstructured grid reservoir model;
initializing the II, JJ and KK properties in the unstructured grid reservoir model;
designing a link scheme in the unstructured grid reservoir model; and
assigning II, JJ and KK properties in the unstructured grid reservoir model.

11. The method recited in claim 1, comprising associating data in the unstructured grid model with the virtual structured grid by defining flow transmissibilities between cells in the virtual structured grid based on flow transmissibilities between cells in the unstructured grid model.

12. The method recited in claim 1, wherein the virtual structured grid comprises cells having a single index differing by one that have no connections.

13. A method for producing hydrocarbons from an oil and/or gas field using a reservoir simulation of the oil and/or gas field, comprising:
obtaining a reservoir model defined on an unstructured grid;
counting the number of grid cells, M, in the unstructured grid;
defining a set of integers whose product, N, is equal to or greater than M;
adding L dummy cells into the unstructured grid to form a second unstructured grid, where L is the difference between N and M;
performing a one-to-one mapping of each cell in the second unstructured grid to a cell in a virtual structured grid;
defining flow transmissibilities between cells in the virtual structured grid based on the flow transmissibilities between cells in the unstructured grid; wherein the virtual structured grid is defined for the reservoir model on the unstructured grid, and wherein the virtual structured grid has no geometrical properties;
performing a reservoir simulation based on the virtual structured grid using a structured grid reservoir simulator; and
extracting hydrocarbons from the oil and/or gas field using the reservoir simulation.

14. The method recited in claim 13, wherein performing the one-to-one mapping comprises copying one or more cell properties from the unstructured grid to the structured grid.

* * * * *